(12) United States Patent
Uemura et al.

(10) Patent No.: US 9,673,803 B2
(45) Date of Patent: Jun. 6, 2017

(54) SEMICONDUCTOR DEVICE, AND ON-VEHICLE ELECTRONIC DEVICE AND AUTOMOBILE EACH INCLUDING SEMICONDUCTOR DEVICE

(71) Applicant: Renesas Electronics Corporation, Tokyo (JP)

(72) Inventors: Akira Uemura, Tokyo (JP); Akihiro Nakahara, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 77 days.

(21) Appl. No.: 14/865,170

(22) Filed: Sep. 25, 2015

(65) Prior Publication Data

US 2016/0099711 A1    Apr. 7, 2016

(30) Foreign Application Priority Data

Oct. 2, 2014    (JP) ................. 2014-203682

(51) Int. Cl.
*H03K 17/14*    (2006.01)
*B60R 16/03*    (2006.01)
*H05B 33/08*    (2006.01)

(52) U.S. Cl.
CPC .......... *H03K 17/145* (2013.01); *B60R 16/03* (2013.01); *H05B 33/089* (2013.01)

(58) Field of Classification Search
CPC ....... B60R 16/03; H03K 17/14; H03K 17/145
See application file for complete search history.

(56) References Cited

U.S. PATENT DOCUMENTS

2009/0072887 A1* 3/2009 Scheikl ............ H03K 17/0822
                                                    327/530
2012/0319740 A1* 12/2012 Thiele ................. H03K 17/14
                                                    327/109
2014/0028357 A1* 1/2014 Mehta ................. H03K 17/063
                                                    327/109

OTHER PUBLICATIONS

Romeo Letor, et al., "How to Implement a Fault Tolerant and Reliable Automotive Power Management System in Short Circuit Operation by Using ST's VIPower MO™ Technology", STMicroelecctronics, stradale Primosole 50, 95121 Catania, Italy, pp. 1-7.

* cited by examiner

*Primary Examiner* — Douglas W Owens
*Assistant Examiner* — Jonathan G Cooper
(74) *Attorney, Agent, or Firm* — McGinn IP Law Group, PLLC

(57) ABSTRACT

A load driving device 10 includes a temperature detector TD1 that sets a temperature difference detection signal dt_ot to active when a temperature difference Tdif between a temperature Ttr of an output transistor T1 and an ambient temperature becomes more than a reference temperature difference Tdref1, and sets an over temperature detection signal at_ot to active when the temperature Ttr of the output transistor T1 becomes higher than a reference temperature Tref1, a current limiter IL1 that limits a GS current of the output transistor T1 when any one of the detection signals becomes active, and the output transistor T1 that turns off regardless of an external input signal IN when any one of the detection signals becomes active. The temperature detector TD1 sets the temperature difference detection signal dt_ot to inactive when the temperature difference Tdif between the output transistor temperature Ttr and the ambient temperature becomes equal to or less than a reference temperature difference Tdref2, and sets the over temperature detection (Continued)

signal at_ot to inactive when the output transistor temperature Ttr becomes equal to or lower than a reference temperature Tref2.

10 Claims, 34 Drawing Sheets

SEMICONDUCTOR DEVICE, AND ON-VEHICLE ELECTRONIC DEVICE AND AUTOMOBILE EACH INCLUDING SEMICONDUCTOR DEVICE

CROSS-REFERENCE TO RELATED APPLICATIONS

This application is based upon and claims the benefit of priority from Japanese patent application No. 2014-203682, filed on Oct. 2, 2014, the disclosure of which is incorporated herein in its entirety by reference.

BACKGROUND

The present invention relates to a semiconductor device, and an on-vehicle electronic device and an automobile each including the semiconductor device and, for example, relates to a semiconductor device suitable for driving a load such a lamp, and an on-vehicle electronic device and an automobile each including the semiconductor device.

An automobile is equipped with an electronic control unit (ECU) that electronically controls an engine, a lamp, an airbag, a power window and other systems. The electronic control unit includes an intelligent power device (IPD) that drives a load such as a lamp.

A technique related to the load driving device is disclosed in Romeo Letor et al, "How to implement a fault tolerant and reliable automotive power management system in short circuit operation by using ST's VIPower M0™ technology". The structure of this related art prevents overheating of an output transistor by limiting the current flowing through the output transistor in stages by using two types of temperature detection functions.

SUMMARY

The problems and novel features of the load driving device will become apparent from the description of the specification and the accompanying drawings.

According to one embodiment, a semiconductor device includes a temperature detector that sets a first detection signal to active when a temperature difference between a temperature of an output transistor and an ambient temperature becomes more than a reference temperature difference and sets a second detection signal to active when a temperature of the output transistor becomes higher than a first reference temperature, a first current limiter that limits a current flowing between a source and a drain of the output transistor when any one of the first and second detection signals becomes active, and the output transistor that turns off regardless of an external input signal when any one of the first and second detection signals is active, and when the first detection signal is set to active, the temperature detector sets the first detection signal to inactive when the temperature difference between the temperature of the output transistor and the ambient temperature decreases to be equal to or less than a value that is smaller than the reference temperature difference by the amount of a first hysteresis, and when the second detection signal is set to active, the temperature detector sets the second detection signal to inactive when the temperature of the output transistor decreases to be equal to or less than a value that is lower than the first reference temperature by the amount of the first hysteresis.

According to one embodiment, a semiconductor device includes a temperature detector that sets a first detection signal to active when a temperature difference between a temperature of an output transistor and an ambient temperature becomes more than a reference temperature difference and sets a second detection signal to active when a temperature of the output transistor becomes higher than a first reference temperature, a first current limiter that limits a current flowing between a source and a drain of the output transistor when any one of the first and second detection signals becomes active, and the output transistor that turns off regardless of an external input signal when any one of the first and second detection signals is active, and the temperature detector includes a first constant current source, a first diode connected in series to the first constant current source and placed in a peripheral circuit region away from the output transistor, a second constant current source, a second diode connected in series to the second constant current source and placed in the output transistor or its proximity, first and second resistor elements connected in parallel between the second constant current source and the second diode, a first switch connected in series to the second resistor element and controlled to turn on and off based on the first detection signal, a second switch connected in parallel to the first switch and controlled to turn on and off based on the second detection signal, a first comparator that compares a potential of a node between the first constant current source and the first diode with a potential of a node between the second constant current source and the first resistor element and outputs the first detection signal, a third constant current source, a third resistor element connected in series to the third constant current source, and a second comparator that compares a potential of a node between the third constant current source and the third resistor element with a potential of the node between the second constant current source and the first resistor element and outputs the second detection signal.

According to the above embodiment, it is possible to provide a semiconductor device capable of preventing a sharp decrease in the capability of driving a load, and an on-vehicle electronic device including the same.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Embodiments of the present invention are described hereinafter with reference to the drawings. It should be noted that the drawings are given in simplified form by way of illustration only, and thus are not to be considered as limiting the present invention. The same elements are denoted by the same reference symbols, and the redundant explanation is omitted.

In the following embodiments, the description will be divided into a plurality of sections or embodiments when necessary for the sake of convenience. However, unless explicitly specified otherwise, those sections or embodiments are by no means unrelated to each other, but are in such a relation that one represents a modification, a detailed or supplementary description, etc. of part or whole of the other. Further, in the following embodiments, when a reference is made to the number etc, (including the number, numeric value, quantity, range, etc.) of elements, except in such cases where it is explicitly specified otherwise or the number is obviously limited to a specific number in principle, the number is not limited to the specific number but may be greater or less than the specific number.

It is needless to mention that, in the following embodiments, their constituent elements (including operation steps) are not necessarily essential, except in such cases where it is explicitly specified otherwise or they are obviously considered to be essential in principle. Likewise, in the following embodiments, when a reference is made to the shape, relative position, etc. of a constituent element or the like, this includes those shapes etc. substantially resembling or similar to that shape etc., except in such cases where it is explicitly specified otherwise or it is obviously considered otherwise in principle. The same applies to the number etc, (including the number, numeric value, quantity, range, etc.) mentioned above.

First Embodiment

Figure 1:
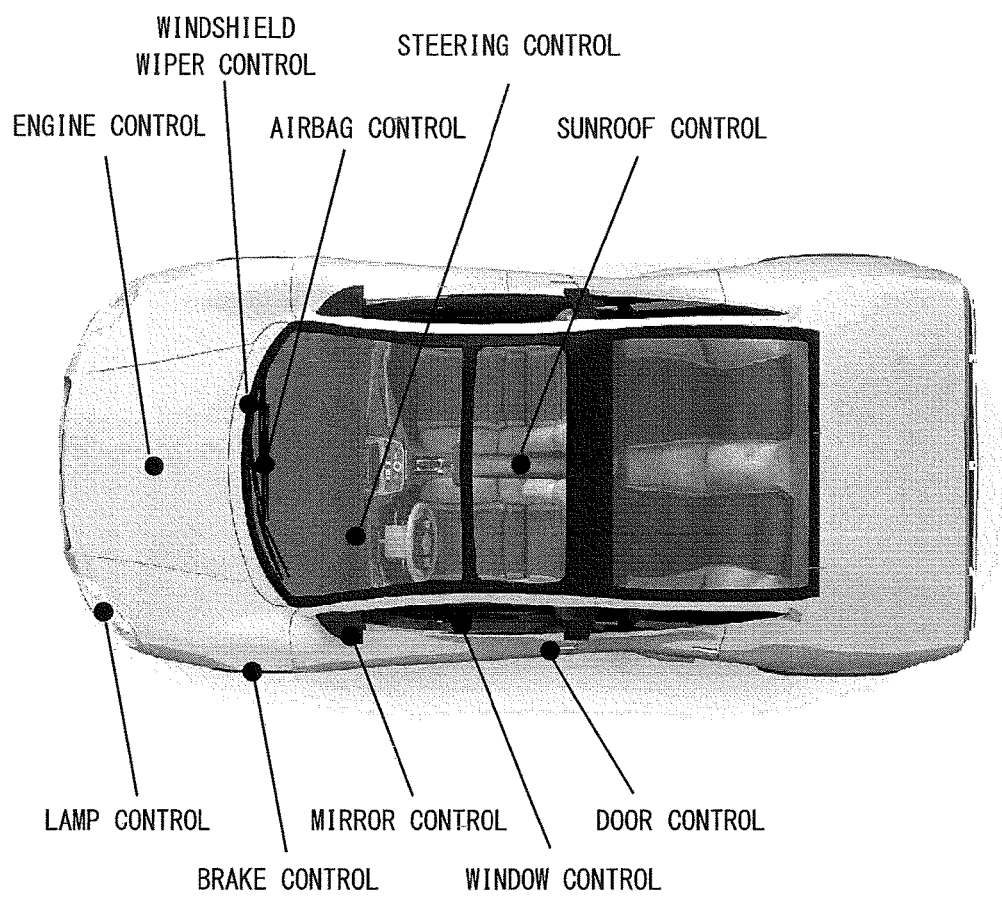
FIG. 1 is an outline view of a vehicle equipped with an electronic control unit according to a first embodiment.

FIG. 1 is an outline view of a vehicle equipped with an electronic control unit according to a first embodiment.

As shown in FIG. 1, the electronic control unit mounted on the vehicle performs various types of control such as engine control, windshield wiper control, airbag control, steering control, sunroof control, lamp control, brake control, mirror control, window control and door control.

Figure 2:
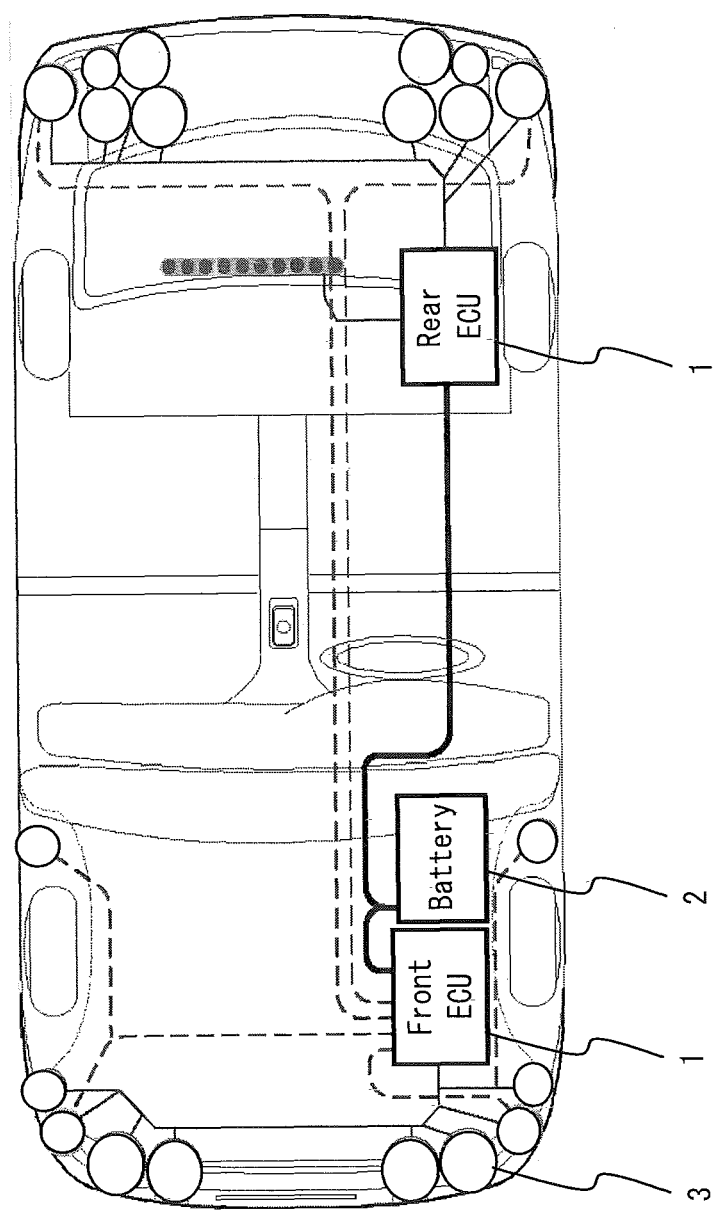
FIG. 2 is a view showing an internal structure of the vehicle shown in FIG. 1.

FIG. 2 is a view showing an internal structure of the vehicle shown in FIG. 1.

As shown in FIG. 2, an electronic control unit 1 performs control of a plurality of lamps mounted on the vehicle, for example.

Figure 3:
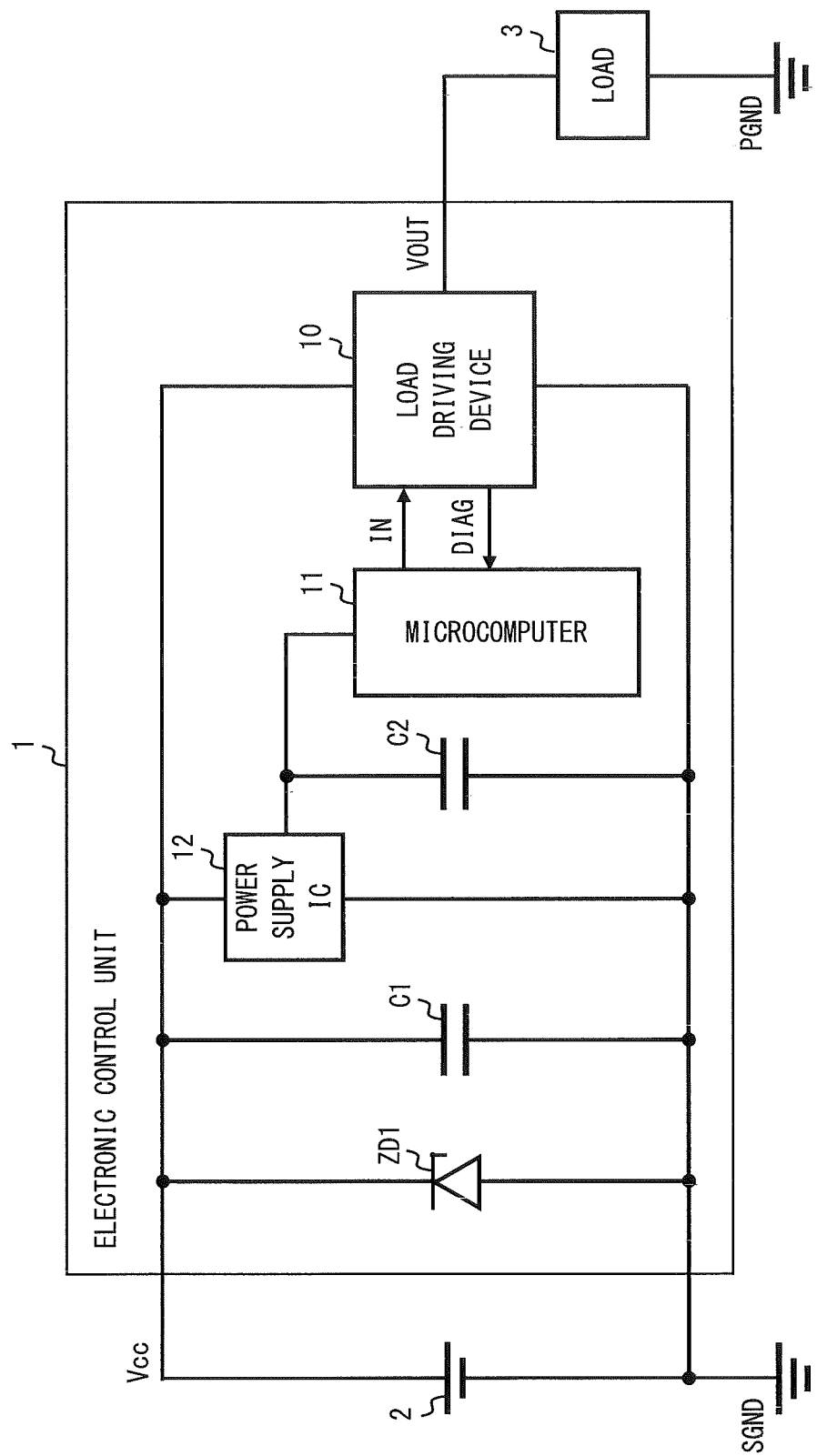
FIG. 3 is a block diagram showing a structure of the electronic control unit according to the first embodiment.

FIG. 3 is a block diagram showing a structure of the electronic control unit 1 according to the first embodiment.

As shown in FIG. 3, the electronic control unit 1 is supplied with a power supply voltage Vcc from a battery power supply 2 and controls driving of a load 3. In this embodiment, the case where the load 3 is a lamp mounted on the vehicle is described as an example.

The electronic control unit 1 includes a load driving device (semiconductor device) 10, a microcomputer (processing unit) 11, a power supply IC 12, stabilizing capacitors C1 and C2, and a Zener diode ZD1. The power supply IC 12 generates a power supply voltage for the microcomputer 11 based on the power supply voltage Vcc. The load driving device 10 drives the load (that is, lights the lamp) when an external input signal IN from the microcomputer 11 becomes active.

(Previous Studies by the Inventors)

Before describing the details of the load driving device 10, a load driving device 50 that has been previously studied by the present inventors will be described.

Figure 26:
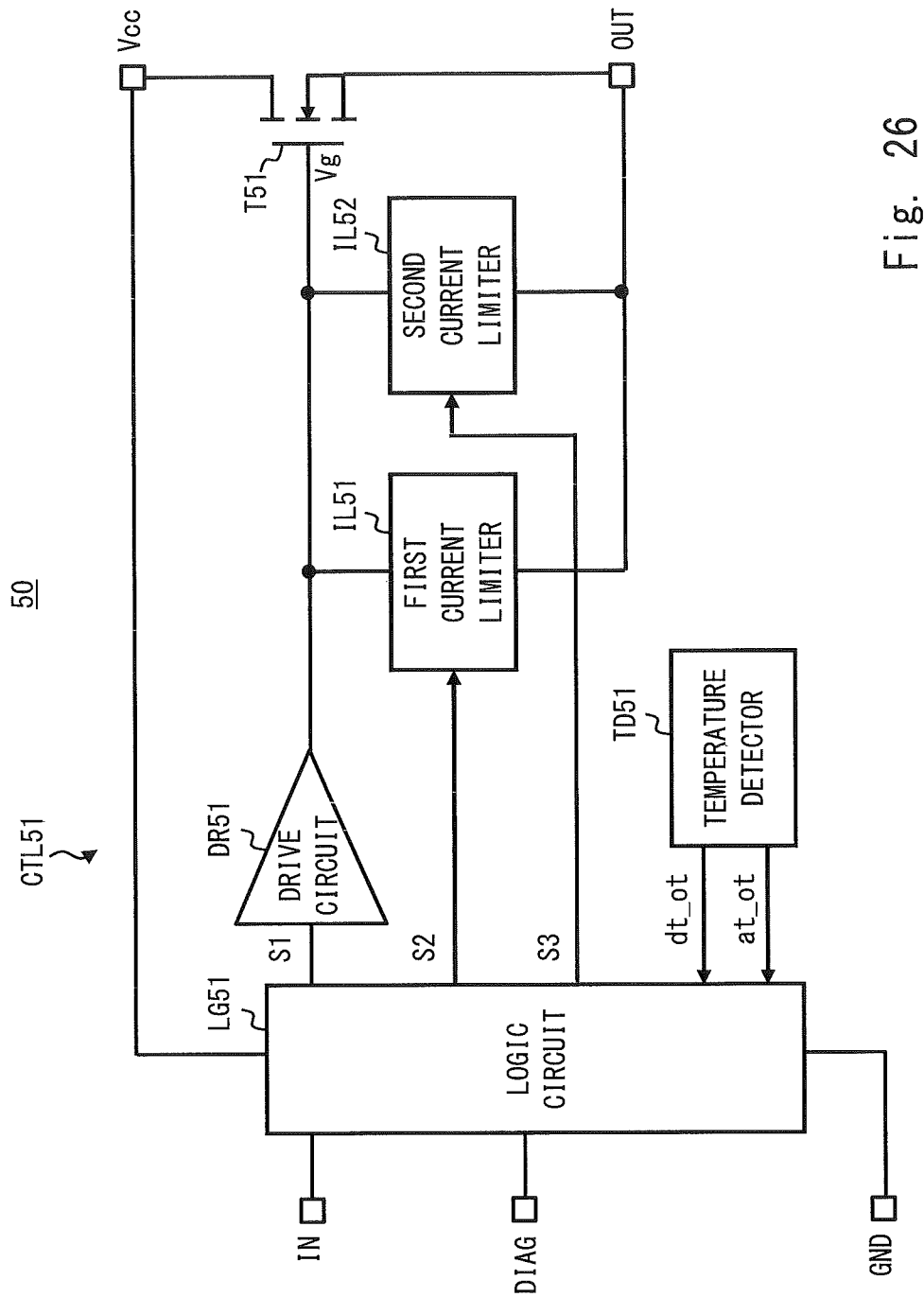
FIG. 26 is a block diagram showing a structure of a load driving device according to an idea before an embodiment has been devised.

FIG. 26 is a block diagram showing a structure of the load driving device 50 according to the idea before the embodiment has been devised.

As shown in FIG. 26, the load driving device 50 includes an output transistor T51, a temperature detector TD51, a logic circuit LG51, a drive circuit DR51, a current limiter (first current limiter) IL51, and a current limiter (second current limiter) IL52. Note that the temperature detector TD51, the logic circuit LG51, the drive circuit DR51, the current limiters IL51 and IL52 constitute a control circuit CTL51.

A power supply voltage is supplied to a power supply voltage terminal Vcc, and a load (which corresponds to "3" in FIG. 2) such as a lamp is connected to an output terminal OUT. The drain electrode and the source electrode of the output transistor T51 are electrically connected to the power supply voltage terminal Vcc and the output terminal OUT, respectively. Then, the output transistor T51 is controlled to turn on and off by a gate voltage Vg that is supplied to its gate. The output transistor T51 is an N-channel MOS transistor in this example, and it turns on when the gate voltage Vg is H level and turns off when the gate voltage Vg is L level.

Figure 27:
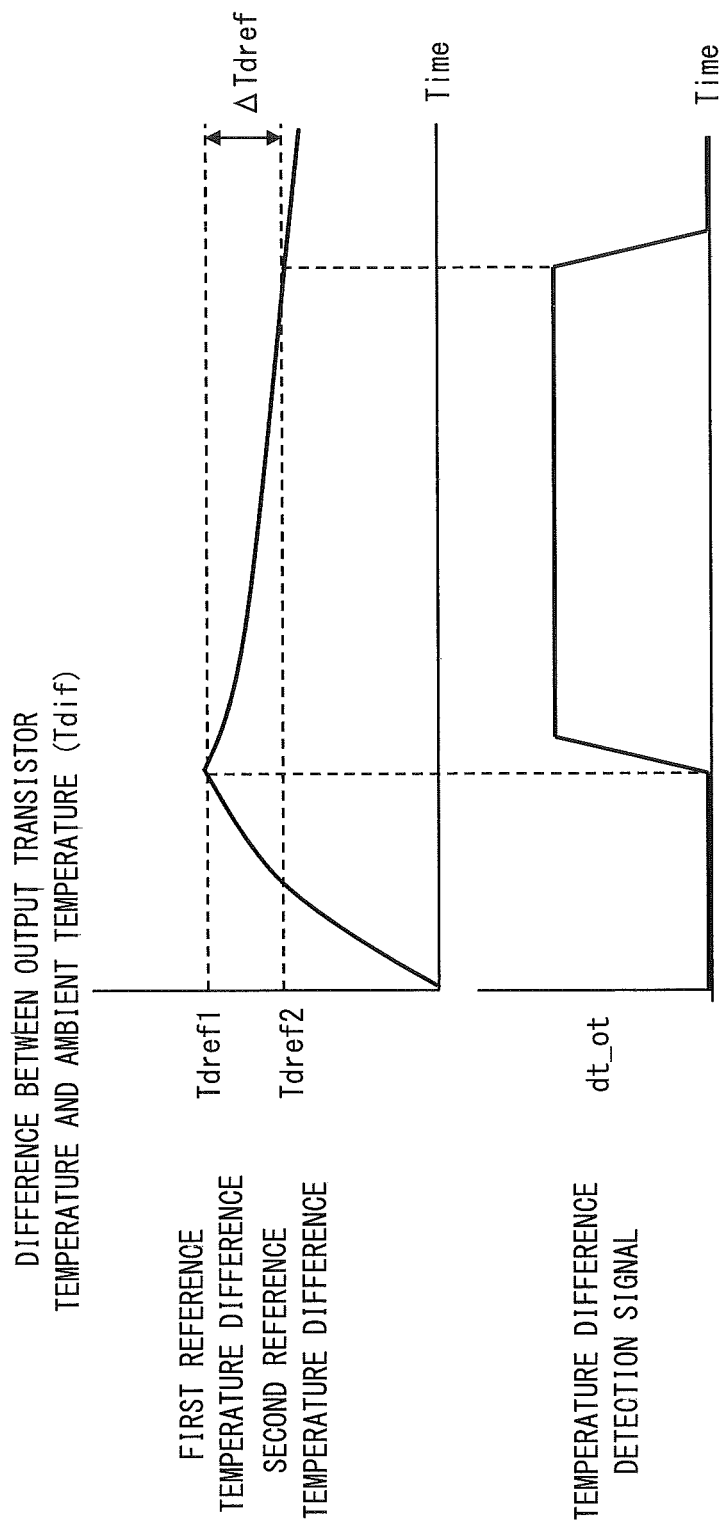
FIG. 27 is a timing chart of each of a temperature difference between an output transistor temperature and an ambient temperature and a temperature difference detection signal.

FIG. 27 is a timing chart of each of a temperature difference Tdif between an output transistor temperature Ttr and an ambient temperature, and a temperature difference detection signal dt_ot.

As shown in FIG. 27, when the temperature difference Tdif between the temperature of the output transistor T51 or its proximity (which is referred to hereinafter as the output transistor temperature Ttr) and the temperature of a peripheral circuit away from the output transistor T51 (which is referred to hereinafter as the ambient temperature) becomes more than a first reference temperature difference Tdref1, the temperature detector TD51 determines that the temperature difference Tdif between the output transistor temperature Ttr and the ambient temperature is excessive and sets the temperature difference detection signal dt_ot to active (from L level to H level, for example). Note that the operation of the temperature detector TD51 that determines whether the temperature difference Tdif between the output transistor temperature Ttr and the ambient temperature is excessive or not is referred to as the temperature difference detection operation.

After that, when the temperature difference Tdif between the output transistor temperature Ttr and the ambient temperature becomes equal to or less than a second reference temperature difference Tdref2, the temperature detector TD51 sets the temperature difference detection signal dt_ot back to inactive (from H level to L level, for example). The second reference temperature difference Tdref2 is smaller than the first reference temperature difference Tdref1. Specifically, the temperature difference detection signal dt_ot has hysteresis characteristics. In this application, a difference ΔTdref between the first reference temperature difference Tdref1 and the second reference temperature difference Tdref2 is defined as a hysteresis value of the temperature difference detection signal dt_ot.

Figure 28:
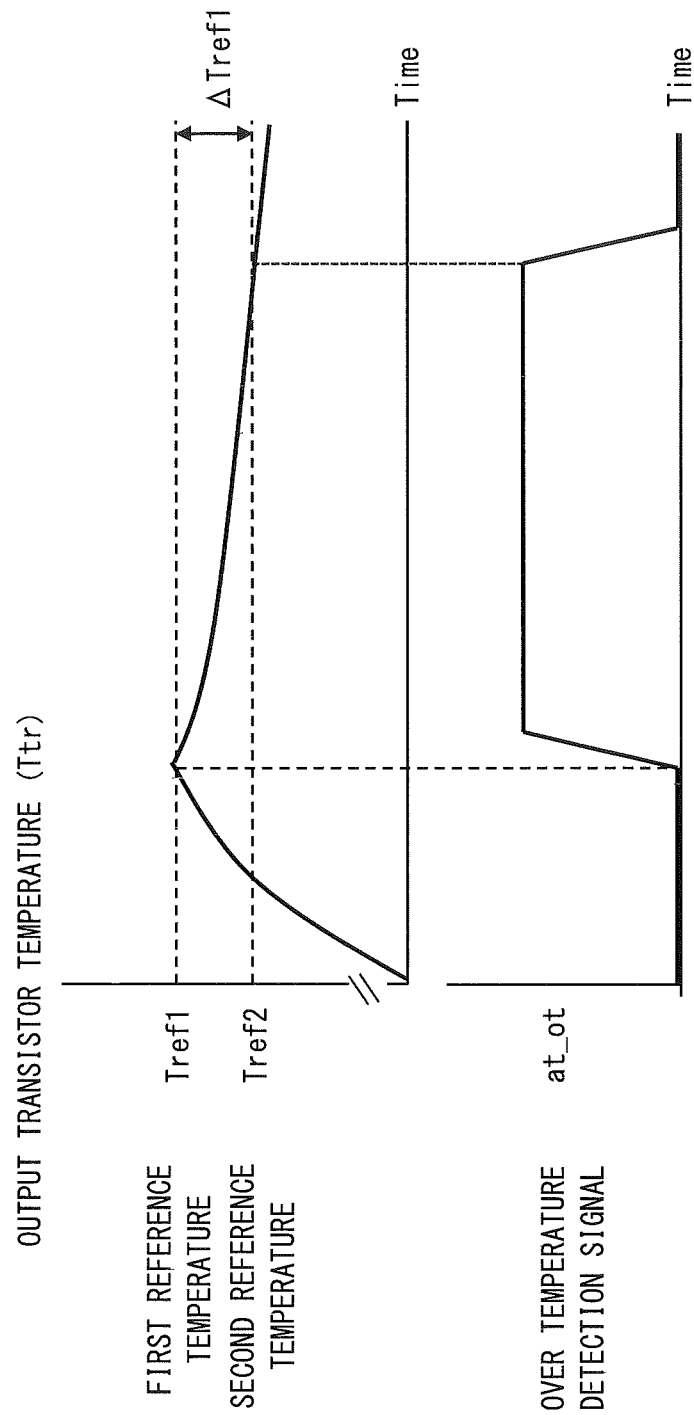
FIG. 28 is a timing chart of each of an output transistor temperature and an over temperature detection signal.

FIG. 28 is a timing chart of each of the output transistor temperature Ttr and the over temperature detection signal at_ot.

As shown in FIG. 28, when the output transistor temperature Ttr becomes higher than a first reference temperature Tref1, the temperature detector TD51 determines that the output transistor temperature Ttr is overheating and sets the over temperature detection signal at_ot to active (from L level to H level, for example). Note that the operation of the temperature detector TD51 that determines whether the output transistor temperature Ttr is overheating or not is referred to as the over temperature detection operation.

After that, when the output transistor temperature Ttr becomes equal to or lower than a second reference temperature Tref2, the temperature detector TD51 sets the over temperature detection signal at_ot back to inactive (from H level to L level, for example). The second reference temperature Tref2 is lower than the first reference temperature Tref1. Specifically, the over temperature detection signal at_ot has hysteresis characteristics. In this application, a difference ΔTref1 between the first reference temperature Tref1 and the second reference temperature Tref2 is defined as a hysteresis value of the over temperature detection signal at_ot.

As described above, the temperature difference detection signal dt_ot and the over temperature detection signal at_ot have hysteresis characteristics in order to prevent the breakdown of the output transistor T51 by allowing the operation of the output transistor T51 to resume after the temperature becomes low enough.

Figure 29:
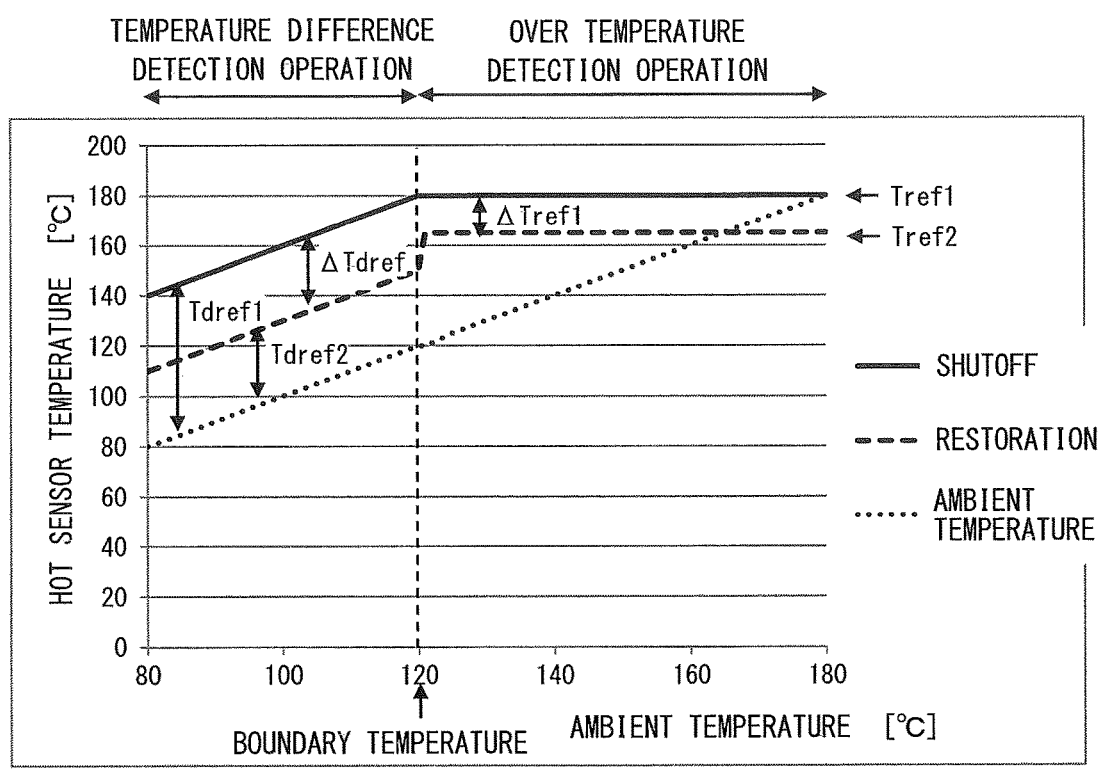
FIG. 29 is a view showing a relationship between a temperature of an output transistor in the load driving device shown in FIG. 26 and an ambient temperature.

FIG. 29 is a view showing a relationship between the temperature (HOT sensor temperature) of the output transistor T51 in the load driving device 50 and the ambient temperature (COLD sensor temperature). The solid line indicates a temperature (shutoff temperature) when the operation of the output transistor T51 stops, and the dotted line indicates a temperature (restoration temperature) when the operation of the output transistor T51 resumes.

The example of FIG. 29 shows the case where the first reference temperature difference Tdref1 is 60° C., the second reference temperature difference Tdref2 is 30° C., the first reference temperature Tref1 is 180° C., and the second reference temperature Tref2 is 165° C. Accordingly, the hysteresis ΔTdref of the temperature difference detection signal dt_ot is 30° C., and the hysteresis ΔTref1 of the over temperature detection signal at_ot is 15° C. When the difference Tdif between the temperature Ttr of the output transistor T51 and the ambient temperature reaches 60° C., which is the first reference temperature difference Tdref1, the temperature difference detection signal dt_ot becomes active, and the operation of the output transistor T51 stops. Further, when the temperature Ttr of the output transistor T51 reaches 180° C., which is the first reference temperature Tref1, the over temperature detection signal at_ot becomes active, and the operation of the output transistor T51 stops. In the example of FIG. 29, the temperature difference detection operation works when the ambient temperature is equal to or lower than 120° C., and the over temperature detection operation works when the ambient temperature is higher than 120° C.

The logic circuit LG51 outputs a control signal S1 corresponding to the external input signal IN supplied from the outside. For example, when the external input signal IN at H level for driving the load is input, the logic circuit LG51 outputs the control signal S1 at H level, and when the external input signal IN at L level for stopping the driving of the load is input, the logic circuit LG51 outputs the control signal S1 at L level. The control signal S1 is driven by the drive circuit DR51 and then supplied to the gate of the output transistor T51.

Note that, when any one of the temperature difference detection signal dt_ot and the over temperature detection signal at_ot output from the temperature detector TD51 becomes active, the logic circuit LG51 sets the control signal S1 to inactive (L level) regardless of the external input signal IN. The output transistor T51 thereby turns off regardless of the external input signal IN. In other words, when the overheating of the output transistor T51 is detected by the temperature detector TD51, the load driving device 50 shuts off the current supply to the load. It is thereby possible to prevent the breakdown of the output transistor T51.

After that, when both of the temperature difference detection signal dt_ot and the over temperature detection signal at_ot output from the temperature detector TD51 become inactive, the logic circuit LG51 starts outputting the control signal S1 corresponding to the external input signal IN again. In other words, when the output transistor temperature Ttr becomes low enough, the load driving device 50 restores the current supply to the load.

The logic circuit LG51 further outputs control signals S2 and S3. To be specific, when the temperature difference detection signal dt_ot becomes active, the logic circuit LG51 sets the control signal S2 to active (H level), and when the over temperature detection signal at_ot becomes active, the logic circuit LG51 sets the control signals S2 and S3 to active (H level). The control signal S2 is supplied to the current limiter IL51, and the control signal S3 is supplied to the current limiter IL52.

The current limiters IL51 and IL52 limit the current flowing through the output transistor T51 after the restoration of the current supply to a lower current value than in normal times when the control signals S2 and S3 are active, respectively.

For example, when an excessive temperature difference is detected by the temperature difference detection operation (when the temperature difference detection signal dt_ot becomes active), the current limit is made by the current limiter IL51 only, and therefore the limited current value is limited to a first limited current value. On the other hand, when an over temperature is detected by the over temperature detection operation (when the over temperature detection signal at_ot becomes active), the current limit is made by both of the current limiters IL51 and IL52, and therefore the limited current value is limited to a second limited current value, which is lower than the first limited current value.

To be specific, each of the current limiters IL51 and IL52 respectively has switching elements that are connected in series between the gate and the source of the output transistor T51, and turns on the switch when the control signals S2 and S3 are active and thereby makes the gate and the source of the output transistor T51 conducting through a specified resistor component. Note that the logic circuit LG51 has a function of latching the control signals S2 and S3, and once the temperature difference detection signal dt_ot and the over temperature detection signal at_ot become active and thereby the control signals S2 and S3 become active, even when the temperature difference detection signal dt_ot and the over temperature detection signal at_ot become inactive after that, the control signals S2 and S3 are kept active. Therefore, each of the current limiters IL51 and IL52 keeps limiting the current flowing through the output transistor T51.

Figure 30:
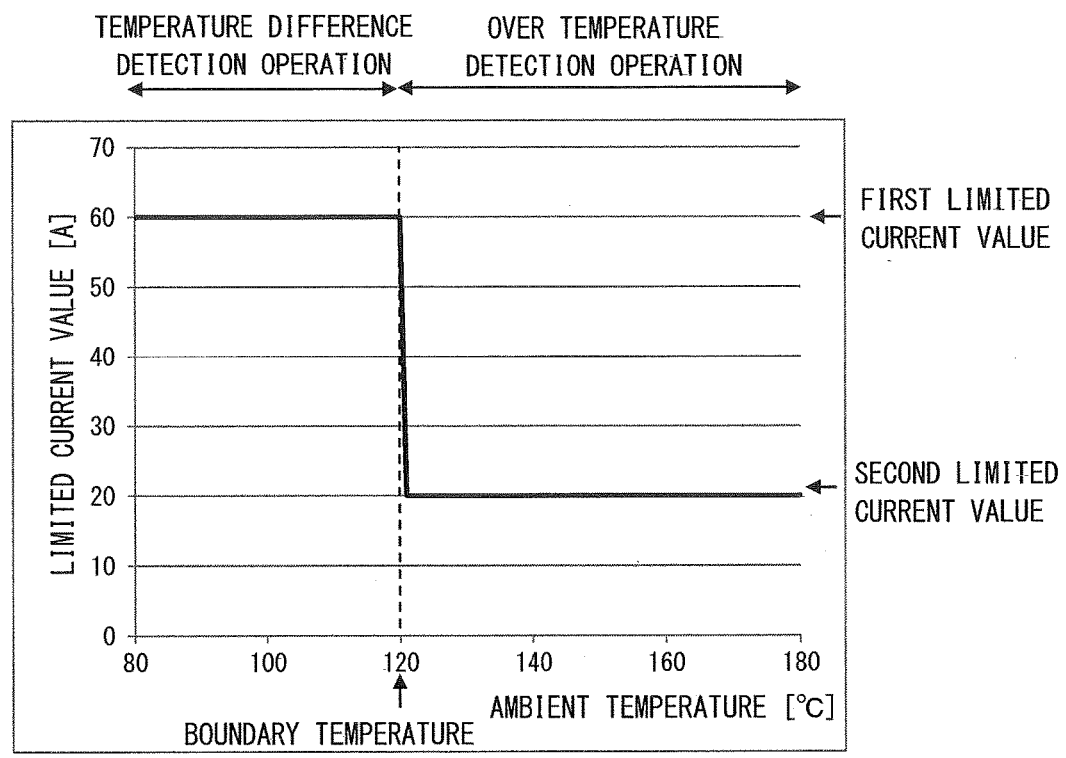
FIG. 30 is a view showing a relationship between a limited current value set by the load driving device shown in FIG. 26 and an ambient temperature.

FIG. 30 is a view showing a relationship between the limited current value set by the load driving device 50 and the ambient temperature.

Referring to FIG. 30, when the ambient temperature is equal to or lower than 120° C. (boundary temperature), the current limit is made by the current limiter IL51 only, and therefore the limited current value is 60 A (the first limited current value). On the other hand, when the ambient temperature is higher than 120° C., the current limit is made by both of the current limiters IL51 and IL52, and therefore the limited current value is 20 A (the second limited current value). In other words, at the ambient temperature where the temperature difference detection operation works, the limited current value is limited to the first limited current value, and at the ambient temperature where the over temperature detection operation works, the limited current value is limited to the second limited current value, which is lower than the first limited current value.

As described above, in the load driving device 50, at the ambient temperature where the temperature difference detection operation works (at the ambient temperature equal to or lower than the boundary temperature), the limited current value is limited to the first limited current value, which is lower than in normal times, and at the ambient temperature where the over temperature detection operation works (at the ambient temperature higher than the boundary temperature), the limited current value is limited to the second limited current value, which is lower than the first limited current value. Thus, the load driving device 50 limits the current flowing through the output transistor T51 in stages by using the two types of temperature detection functions and thereby prevents the overheating of the output transistor T51.

However, in the load driving device 50, when the ambient temperature is equal to or lower than the boundary temperature, only the current limiter IL51 operates and therefore the limited current value is not lowered so much, but when the ambient temperature is only slightly higher than the boundary temperature, the current limiter IL52 operates in addition and therefore the limited current value is significantly lowered, and the capability of driving the load decreases sharply. Thus, in the load driving device 50, there is a possibility that the load cannot be driven sufficiently due to a slight difference in the ambient temperature. This is specifically described hereinafter using the case where the load is a lamp, for example.

Figure 31:
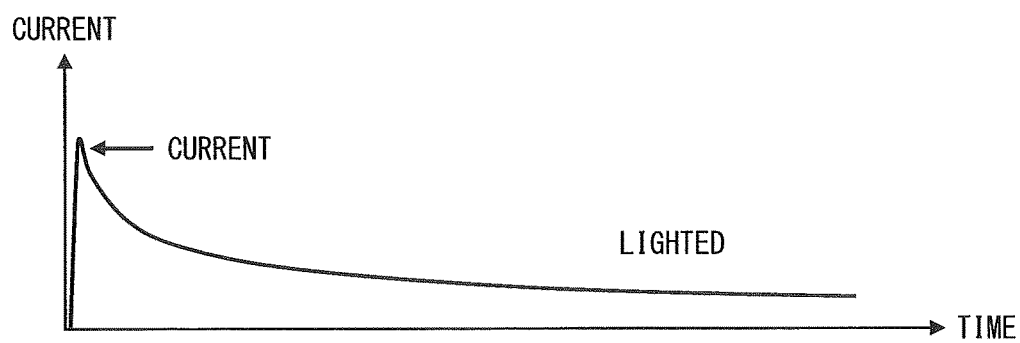
FIG. 31 is a view showing a change over time in an ideal current supplied to a lamp.

FIG. 31 is a view showing a change over time in the ideal current supplied to a lamp.

As shown in FIG. 31, when driving a lamp, the resistance of a filament in the lamp is very low at the initial stage of driving, and therefore a very large current flows through the lamp. After that, when the temperature of the filament increases by the current, the resistance value of the filament becomes large, and therefore the current flowing through the lamp becomes small. As a result, the lamp is stably lighted. Thus, when driving the lamp, it is necessary to flow a very large current through the lamp at the initial stage of driving.

Figure 32:
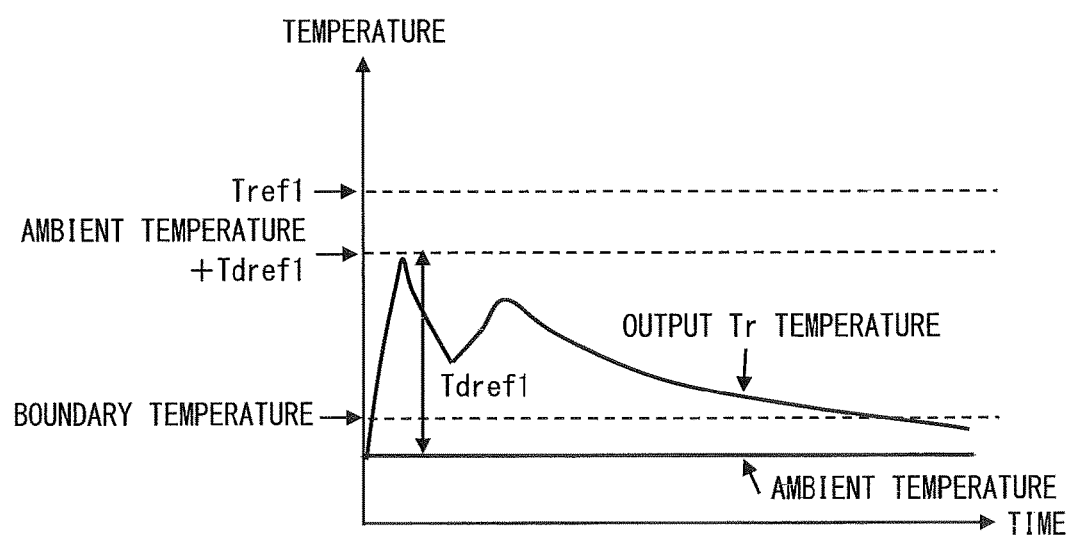
FIG. 32 is a view showing a change over time in an output transistor temperature when a lamp is driven by the load driving device shown in FIG. 26 in the case where an ambient temperature is equal to or lower than a boundary temperature.
Figure 33:
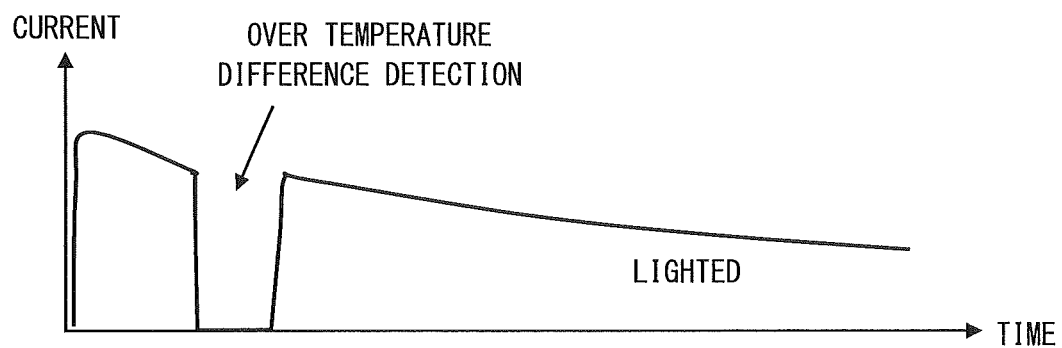
FIG. 33 is a view showing a change over time in a current supplied to a lamp by the load driving device shown in FIG. 26 in the case where an ambient temperature is equal to or lower than a boundary temperature.

FIG. 32 is a view showing a change over time in the output transistor temperature Ttr when the lamp is driven by the load driving device 50 in the case where the ambient temperature is equal to or lower than the boundary temperature. FIG. 33 is a view showing a change over time in the current supplied to the lamp by the load driving device 50 in the case where the ambient temperature is equal to or lower than the boundary temperature.

As shown in FIG. 32, when the ambient temperature is equal to or lower than the boundary temperature, only the current limiter IL51 works, and therefore the limited current value that is set when the output transistor T51 turns on after that is not so low. Accordingly, the lamp is stably lighted after that.

Figure 34:
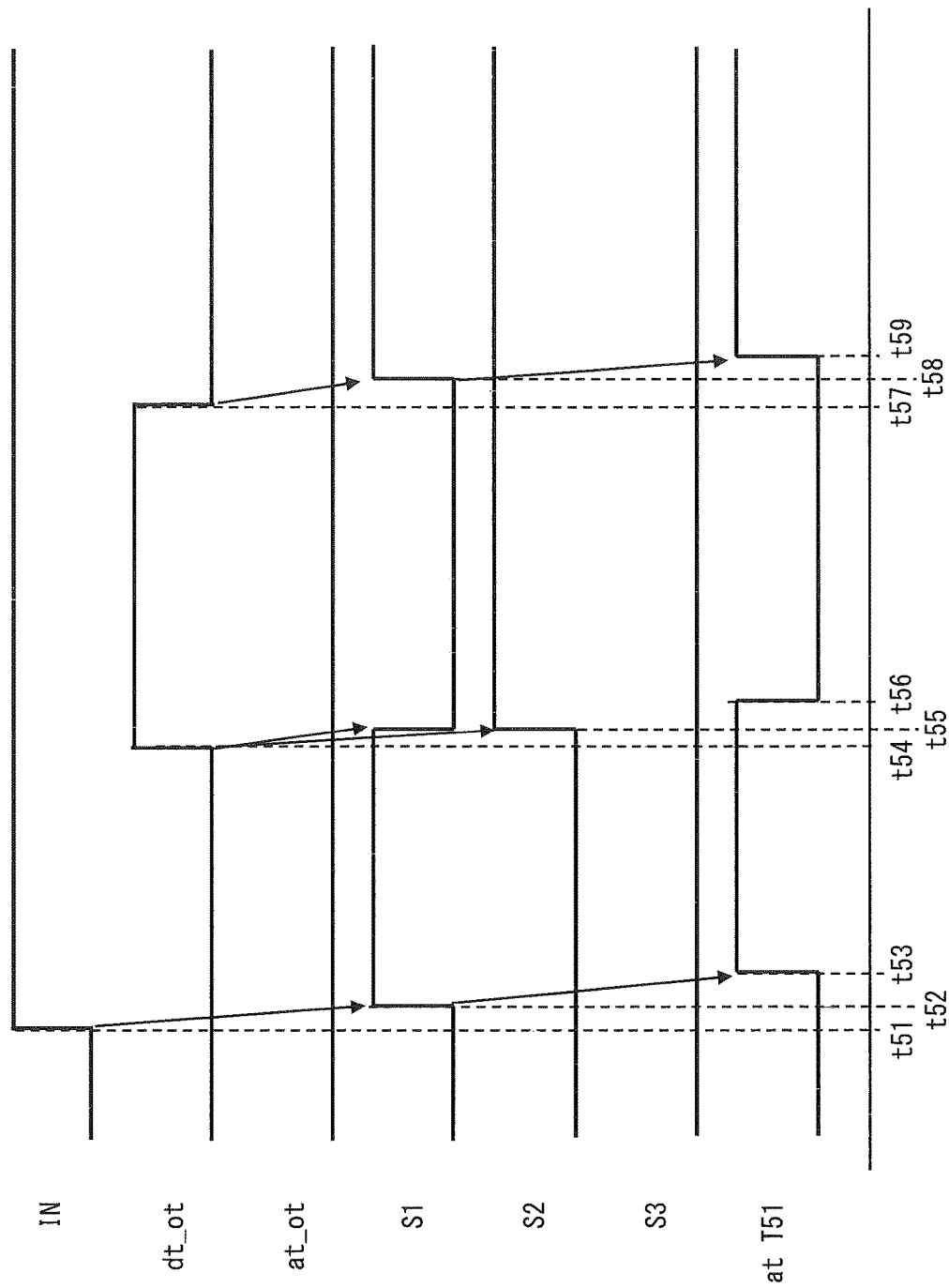
FIG. 34 is a timing chart showing an operation of the load driving device shown in FIG. 26 in the case where an ambient temperature is equal to or lower than a boundary temperature.

FIG. 34 is a timing chart showing the operation of the load driving device 50 in the case where the ambient temperature is equal to or lower than the boundary temperature.

As shown in FIG. 34, when the external input signal IN rises (time t51), the control signal S1 rises accordingly (time t52). The gate voltage Vg of the output transistor T51 thereby rises (time t53), and the output transistor T51 turns on. As a result, a current is supplied to the lamp.

Then, when the temperature difference Tdif between the output transistor temperature Ttr and the ambient temperature becomes more than the first reference temperature difference Tdref1 and thereby the temperature difference detection signal dt_ot rises (time t54), the control signal S1 falls regardless of the external input signal IN (time t55). The gate voltage Vg of the output transistor T51 thereby falls (time t56), and the output transistor T51 turns off regardless of the external input signal IN. As a result, the current supply to the lamp is shut off.

After that, when the temperature difference Tdif between the output transistor temperature Ttr and the ambient temperature becomes equal to or less than the second reference temperature difference Tdref2 and thereby the temperature difference detection signal dt_ot falls (time t57), the control signal S1 rises again (time t58). The gate voltage Vg of the output transistor T51 thereby rises (time t59), and the output transistor T51 turns on again. As a result, the current supply to the lamp is restored.

Note that, when the temperature difference detection signal dt_ot rises (time t54), not only the control signal S1 but also the control signal S2 rises (time t55). Once the control signal S2 rises, it maintains H level without falling even when the temperature difference detection signal dt_ot falls after that (time t57). Accordingly, the current flowing through the output transistor T51 after the restoration of the current supply is limited to the first limited current value, which is lower than in normal times.

Figure 35:
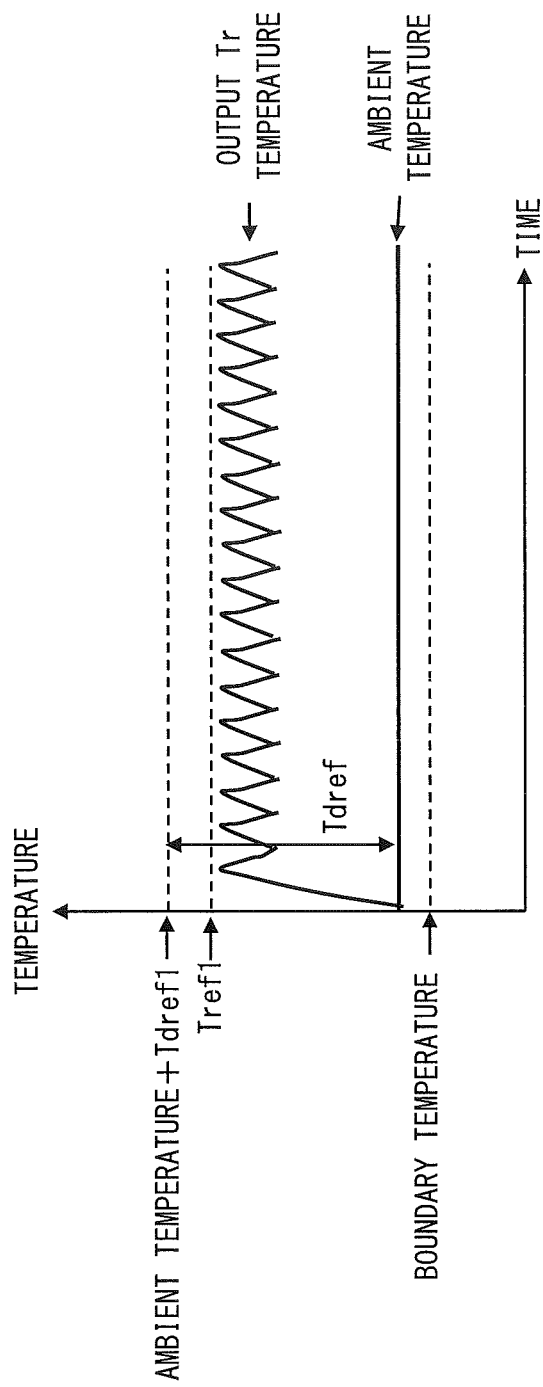
FIG. 35 is a view showing a change over time in an output transistor temperature when a lamp is driven by the load driving device shown in FIG. 26 in the case where an ambient temperature is higher than a boundary temperature.
Figure 36:
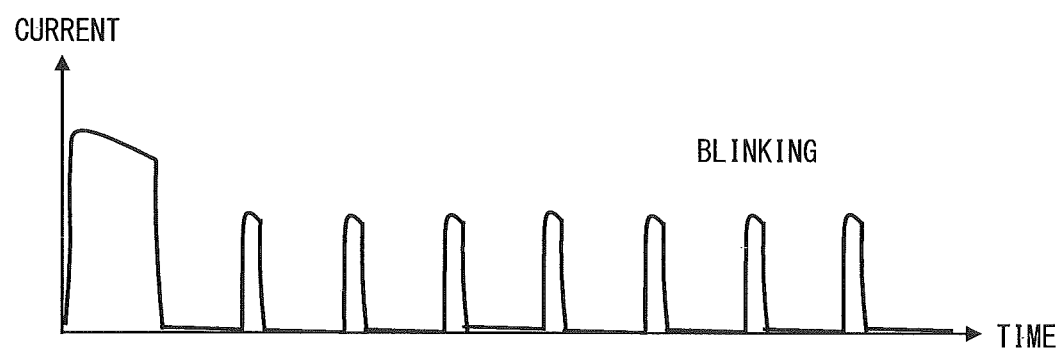
FIG. 36 is a view showing a change over time in a current supplied to a lamp by the load driving device shown in FIG. 26 in the case where an ambient temperature is higher than a boundary temperature.

FIG. 35 is a view showing a change over time in the output transistor temperature Ttr when the lamp is driven by the load driving device 50 in the case where the ambient temperature is higher than the boundary temperature. FIG. 36 is a view showing a change over time in the current supplied to the lamp by the load driving device 50 in the case where the ambient temperature is higher than the boundary temperature.

As shown in FIG. 35, when the ambient temperature is higher than the boundary temperature, the current limiter IL51 and the current limiter IL52 operate, and therefore the limited current value that is set when the output transistor T51 turns on after that is very low. Accordingly, the capability of driving the lamp by the load driving device 50 decreases sharply, and thus the lamp blinks.

Figure 37:
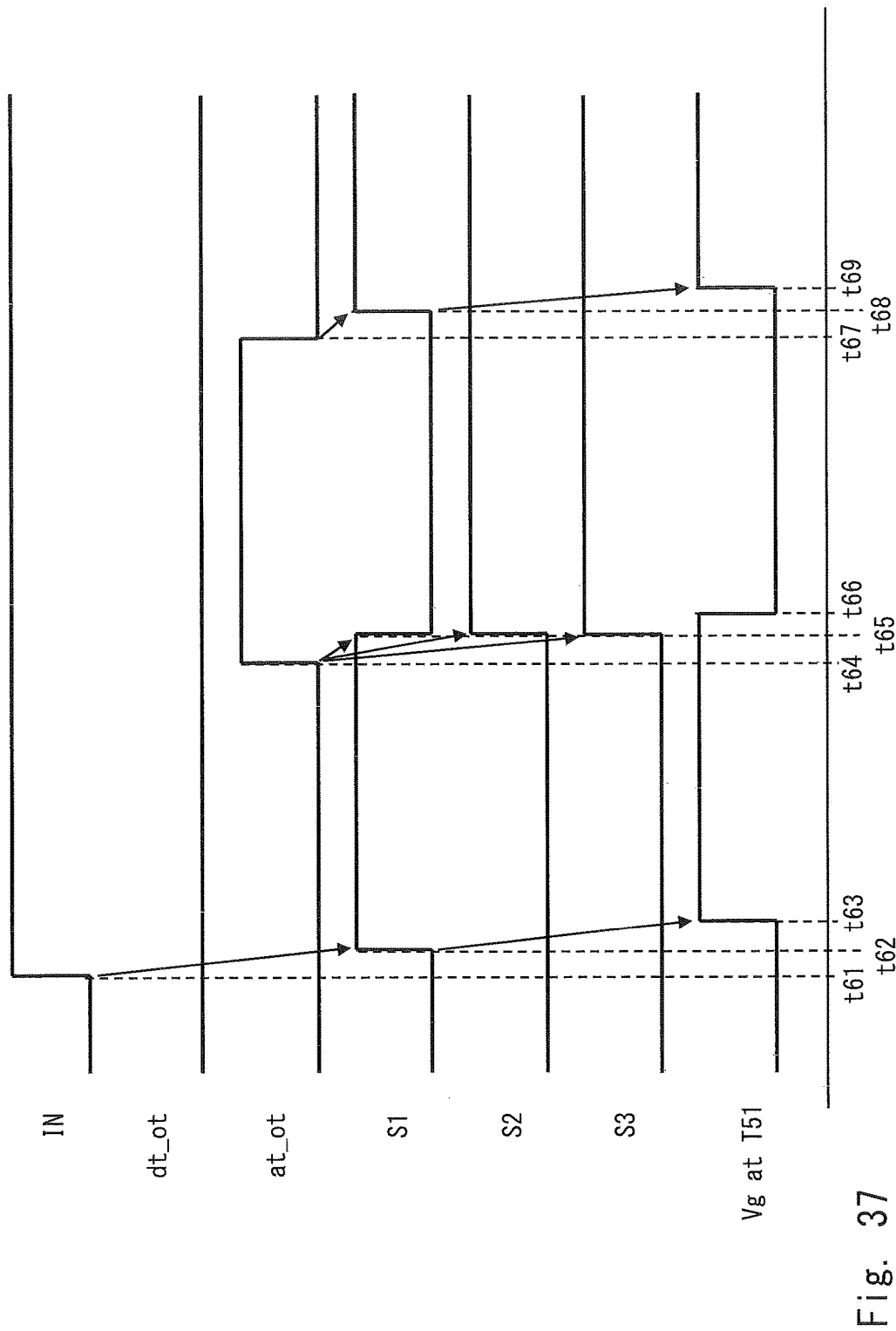
FIG. 37 is a timing chart showing an operation of the load driving device shown in FIG. 26 in the case where an ambient temperature is higher than a boundary temperature.

FIG. 37 is a timing chart showing the operation of the load driving device 50 in the case where the ambient temperature is higher than the boundary temperature.

As shown in FIG. 37, when the external input signal IN rises (time t61), the control signal S1 rises accordingly (time t62). The gate voltage Vg of the output transistor T51 thereby rises (time t63), and the output transistor T51 turns on. As a result, a current is supplied to the lamp.

Then, when the output transistor temperature Ttr becomes higher than the first reference temperature Tref1 and thereby the over temperature detection signal at_ot rises (time t64), the control signal S1 falls regardless of the external input signal IN (time t65). The gate voltage Vg of the output transistor T51 thereby falls (time t66), and the output transistor T51 turns off regardless of the external input signal IN. As a result, the current supply to the lamp is shut off.

After that, when the output transistor temperature Ttr becomes equal to or lower than the second reference temperature Tref2 and thereby the over temperature detection signal at_ot falls (time t67), the control signal S1 rises again (time t68). The gate voltage Vg of the output transistor T51 thereby rises (time t69), and the output transistor T51 turns on again. As a result, the current supply to the lamp is restored.

Note that, when the over temperature detection signal at_ot rises (time t64), not only the control signal S1 but also the control signals S2 and S3 rise (time t65). Once the control signals S2 and S3 rise, they maintain H level without falling even when the over temperature detection signal at_ot falls after that (time t67). Accordingly, the current flowing through the output transistor T51 after the restoration of the current supply is limited to the second limited current value, which is lower than the first limited current value.

As described above, in the load driving device 50, there is a possibility that the load cannot be driven sufficiently due to a slight difference in the ambient temperature, particularly when the ambient temperature is close to the boundary temperature. However, if only the first limited current value is set without using the second current limiter IL52, the possibility that the output transistor T51 breaks down increases when the ambient temperature becomes higher than the boundary temperature.

In view of the above, the load driving device 10 according to this embodiment has been found in order to achieve the compatibility between the protection function and the driving capability of the output transistor.

(Structure of Intelligent Power Device 10)

Figure 4:
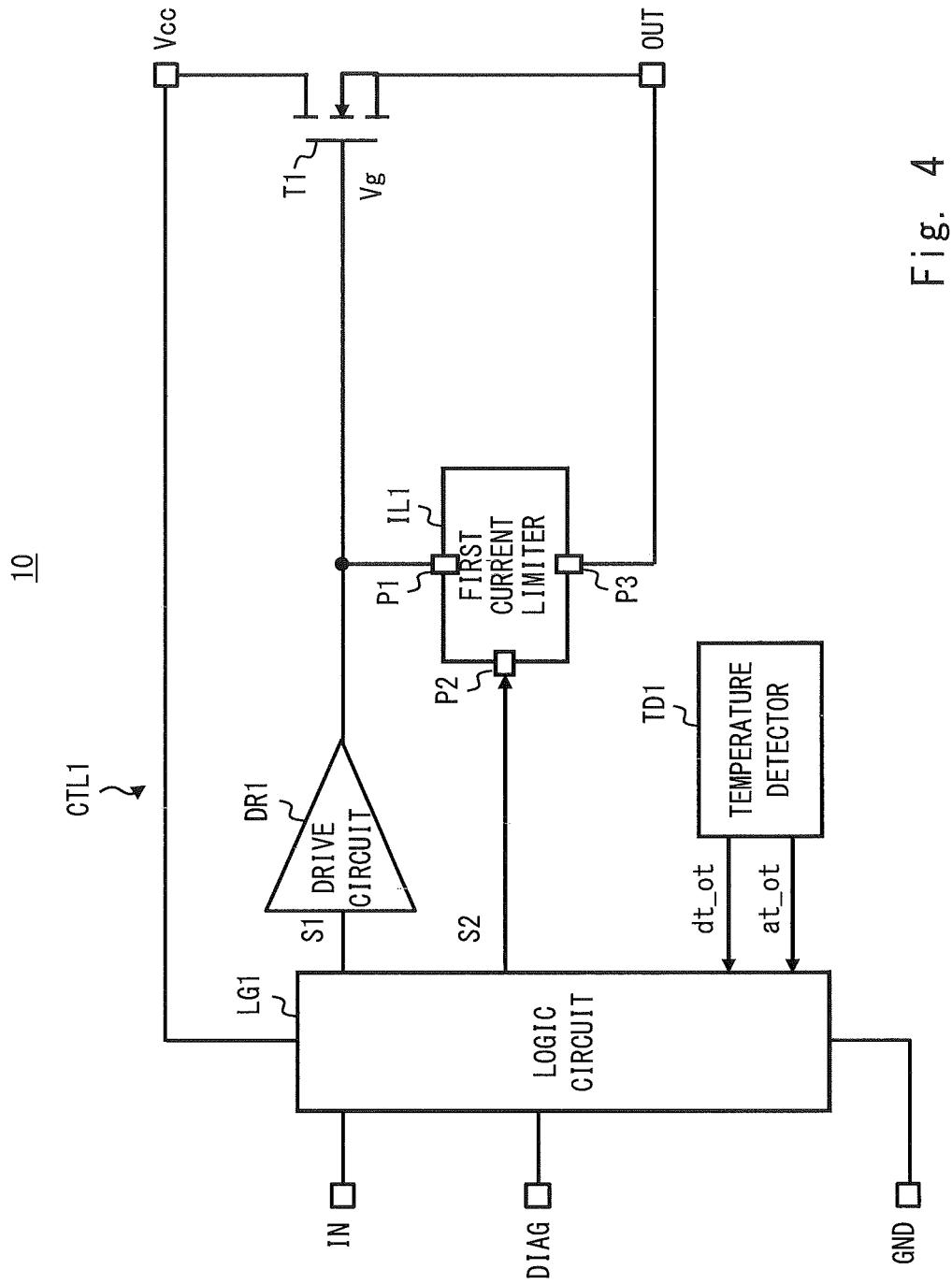
FIG. 4 is a block diagram showing a structure of a load driving device according to the first embodiment.

FIG. 4 is a block diagram showing the structure of the load driving device 10.

As shown in FIG. 4, the load driving device 10 includes an output transistor T1, a temperature detector TD1, a logic circuit LG1, a drive circuit DR1, and a current limiter (first current limier) IL1. Note that the temperature detector TD1, the logic circuit LG1, the drive circuit DR1 and the current limiter IL1 constitute a control circuit CTL1.

The drain electrode of the output transistor T1 is electrically connected to the power supply voltage terminal Vcc, and the source electrode of the output transistor T1 is electrically connected to the output terminal OUT to which a load (which corresponds to "3" in FIG. 2) such as a lamp is connected. Then, the output transistor T1 is controlled to turn on and off by a gate voltage Vg that is supplied to its gate. The output transistor T1 is an N-channel MOS transistor in this example, and it turns on when the gate voltage Vg is H level and turns off when the gate voltage Vg is L level. Note that, however, the output transistor T1 is not limited to an N-channel MOS transistor, and it may be a P-channel MOS transistor.

When the temperature difference Tdif between the temperature of the output transistor T1 or its proximity (which is referred to hereinafter as the output transistor temperature Ttr) and the temperature of a peripheral circuit away from the output transistor T1 (which is referred to hereinafter as the ambient temperature) becomes more than a reference temperature difference Tdref1, the temperature detector TD1 determines that the temperature difference Tdif between the output transistor temperature Ttr and the ambient temperature is excessive and sets the temperature difference detection signal (first detection signal) dt_ot to active (from L level to H level, for example). Note that the operation of the temperature detector TD1 that determines whether the temperature difference Tdif between the output transistor temperature Ttr and the ambient temperature is excessive or not is referred to as the temperature difference detection operation.

After that, when the temperature difference Tdif between the output transistor temperature Ttr and the ambient temperature becomes equal to or less than a second reference temperature difference Tdref2 (=Tdref1−ΔTdref), the temperature detector TD1 sets the temperature difference detection signal dt_ot back to inactive (from H level to L level, for example).

When the output transistor temperature Ttr becomes higher than a first reference temperature Tref1, the temperature detector TD1 determines that the output transistor temperature Ttr is overheating and sets the over temperature detection signal (second detection signal) at_ot to active (from L level to H level, for example). Note that the operation of the temperature detector TD1 that determines whether the output transistor temperature Ttr is overheating or not is referred to as the over temperature detection operation.

After that, when the output transistor temperature Ttr becomes equal to or lower than a second reference temperature Tref2 (=Tref1−ΔTref1), the temperature detector TD1 sets the over temperature detection signal at_ot back to inactive (from H level to L level, for example).

The logic circuit LG1 outputs a control signal S1 corresponding to the external input signal IN supplied from the outside. For example, when the external input signal IN at H level for driving the load is input, the logic circuit LG1 outputs the control signal S1 at H level, and when the external input signal IN at L level for stopping the driving of the load is input, the logic circuit LG1 outputs the control signal S1 at L level. The control signal S1 is driven by the drive circuit DR1 and then supplied to the gate of the output transistor T1.

Note that, when any one of the temperature difference detection signal dt_ot and the over temperature detection signal at_ot output from the temperature detector TD1 becomes active, the logic circuit LG1 sets the control signal S1 to inactive (L level) regardless of the external input signal IN. The output transistor T1 thereby turns off regardless of the external input signal IN. In other words, when the overheating of the output transistor T1 is detected by the temperature detector TD1, the load driving device 10 shuts off the current supply to the load. It is thereby possible to prevent the breakdown of the output transistor T1.

After that, when both of the temperature difference detection signal dt_ot and the over temperature detection signal at_ot output from the temperature detector TD1 become inactive, the logic circuit LG1 starts outputting the control signal S1 corresponding to the external input signal IN again. In other words, when the output transistor temperature Ttr becomes low enough, the load driving device 10 restores the current supply to the load.

The logic circuit LG1 further outputs a control signal S2. To be specific, when any one of the temperature difference detection signal dt_ot and the over temperature detection signal at_ot becomes active, the logic circuit LG1 sets the control signal S2 to active (H level). The control signal S2 is supplied to the current limiter IL1.

The current limiter IL1 limits the current flowing through the output transistor T1 after the restoration of the current supply to a lower current value than in normal times when the control signal S2 is active. Thus, the current flowing through the output transistor T1 after the restoration of the current supply is limited to a first limited current value in any case of the temperature difference detection operation and the over temperature detection operation.

To be specific, the current limiter IL1 has switching elements that are connected in series between the gate and the source of the output transistor T1, and turns on the switch when the control signal S2 is active and thereby makes the gate and the source of the output transistor T1 conducting through a specified resistor component.

As the amount of gate discharge of the output transistor T1 is larger, the gate voltage of the output transistor T1 decreases, and the current limit becomes more restrictive. However, because the load driving device 10 includes only one current limiter IL1, which is different from the case of the load driving device 50 that includes the two current limiters IL51 and IL52, the current flowing through the output transistor T1 after the restoration of the current supply is always limited to the first limited current value. Note that the logic circuit LG1 has a function of latching the control signal S2, and once the temperature difference detection signal dt_ot and the over temperature detection signal at_ot become active and thereby the control signal S2 becomes active, even when the temperature difference detection signal dt_ot and the over temperature detection signal at_ot become inactive after that, the control signal S2 is kept active. Therefore, the current limiter IL1 keeps limiting the current flowing through the output transistor T1.

(Specific Structure of Current Limiter IL1)

Figure 5:
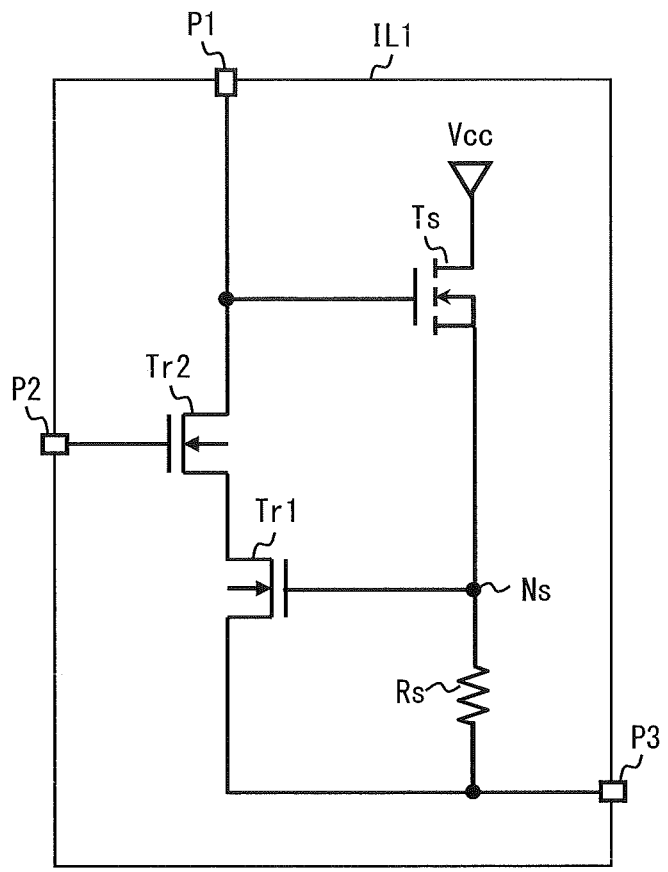
FIG. 5 is a circuit diagram showing a specific structure of a current limiter included in the load driving device shown in FIG. 4.

FIG. 5 is a circuit diagram showing the specific structure of the current limiter IL1.

As shown in FIG. 5, the current limiter IL1 includes a sense transistor Ts, a resistor element Rs, and transistors Tr1 and Tr2. The transistors Tr1 and Tr2 are N-channel MOS transistors in this example. Note that, however, the transistors Tr1 and Tr2 are not limited to N-channel MOS transistors, and they may be P-channel MOS transistors. Further, the sense transistor Ts is a MOS transistor that has the same conductivity type as the output transistor T1 and that is 1/N (N is a natural number) times the cell size of the output transistor T1.

The drain electrode and the source electrode of the sense transistor Ts are electrically connected to a power supply voltage terminal Vcc and a node Ns, respectively. The sense transistor Ts is controlled to turn on and off by a control signal S1 that is supplied to its gate through a terminal P1 of the current limiter IL1. One end of the resistor element Rs is connected to the node Ns, and the other end of the resistor element Rs is connected to an output terminal OUT through a terminal P3 of the current limiter IL1.

The drain electrode of the transistor Tr1 is connected to the source electrode of the transistor Tr2, the source electrode of the transistor Tr1 is connected to the output terminal OUT through the terminal P3 of the current limiter IL1, and the gate electrode of the transistor Tr1 is connected to the node Ns. The drain electrode of the transistor Tr2 is connected to the gate of the output transistor T1 through the terminal P1 of the current limiter IL1, and a control signal S2 is supplied to the gate electrode of the transistor Tr2 through a terminal P2 of the current limiter IL1.

The current that is 1/N times the current of the output transistor T1 flows through the sense transistor Ts. This current is converted into a voltage by the resistor element Rs and supplied to the gate of the transistor Tr1. When an excessive temperature difference or an over temperature is detected and the control signal S2 rises, the gate electrode of the output transistor T1 and the output terminal OUT are brought into conduction through the transistors Tr2 and Tr1, and therefore the current flowing through the output transistor T1 is limited.

(Specific Structure of Temperature Detector TD1)

Figure 6:
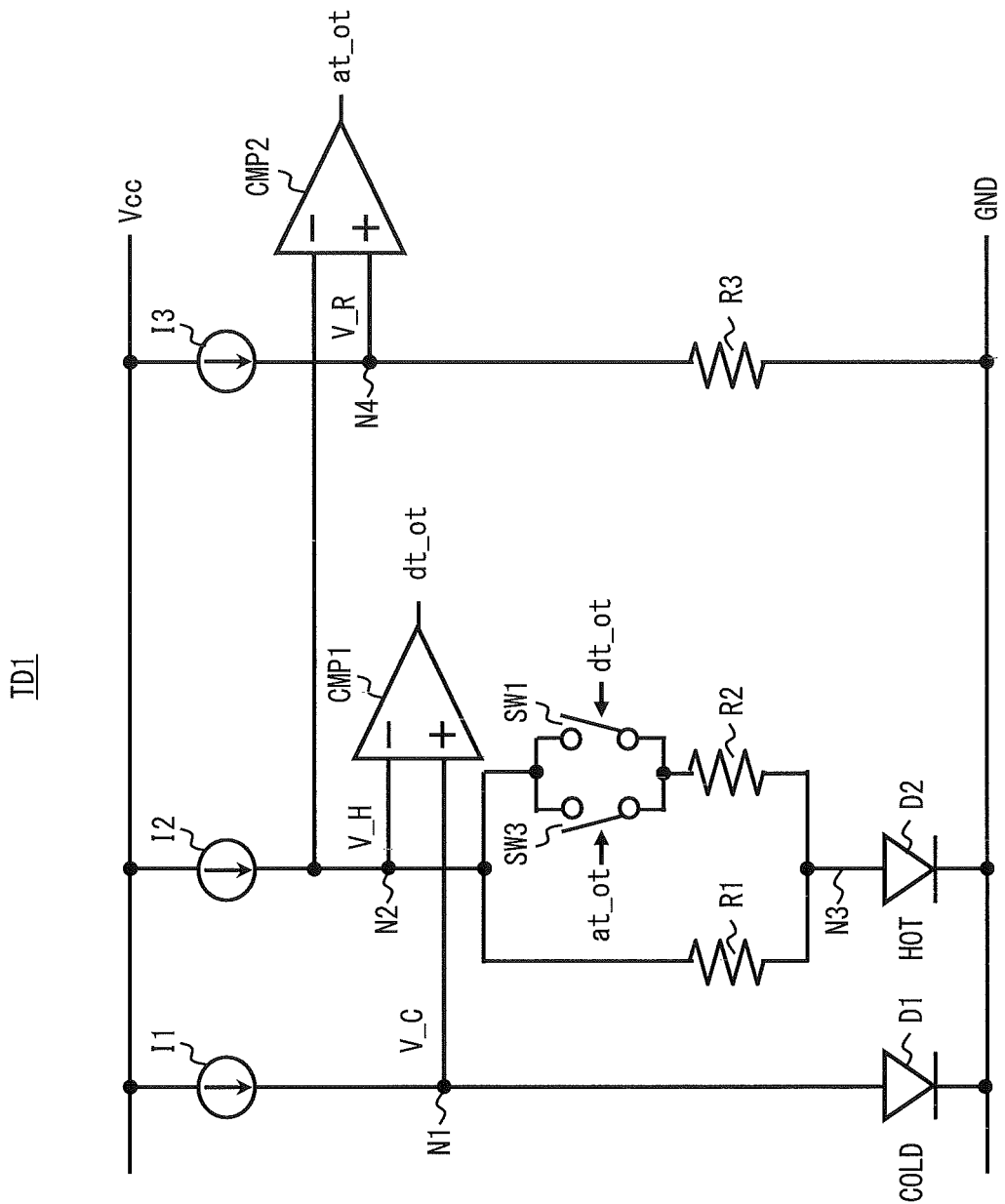
FIG. 6 is a circuit diagram showing a specific structure of a temperature detector included in the load driving device shown in FIG. 4.

The temperature detector TD1 is described in detail hereinbelow. FIG. 6 is a circuit diagram showing the specific structure of the temperature detector TD1.

As shown in FIG. 6, the temperature detector TD1 includes constant current sources I1 to I3, diodes D1 and D2, resistor elements R1 to R3, switches SW1 and SW3, and comparators CMP1 and CMP2. The switches SW1 and SW3 are N-channel MOS transistors, for example.

The constant current source I1 and the diode D1 are connected in series between a power supply voltage terminal Vcc and a ground voltage terminal GND. The diode D1 is placed in a peripheral circuit region that is away from the output transistor T1. Thus, a drop voltage of the diode D1 varies depending on the ambient temperature. For example, when the ambient temperature is high, a drop voltage of the diode D1 becomes low, and when the ambient temperature is low, a drop voltage of the diode D1 becomes high. In other words, the diode D1 serves as a temperature sensor that detects the ambient temperature. Hereinafter, the diode D1 is referred to as a COLD sensor in some cases.

The constant current source I2 and the diode D2 are connected in series between the power supply voltage terminal Vcc and the ground voltage terminal GND. The diode D2 is placed in the output transistor T1 or its proximity. Thus, a drop voltage of the diode D2 varies depending on the output transistor temperature Ttr. For example, when the output transistor temperature Ttr is high, a drop voltage of the diode D2 becomes low, and when the output transistor temperature Ttr is low, a drop voltage of the diode D2 becomes high. In other words, the diode D2 serves as a temperature sensor that detects the output transistor temperature Ttr. Hereinafter, the diode D2 is referred to as a HOT sensor in some cases.

Figure 7:
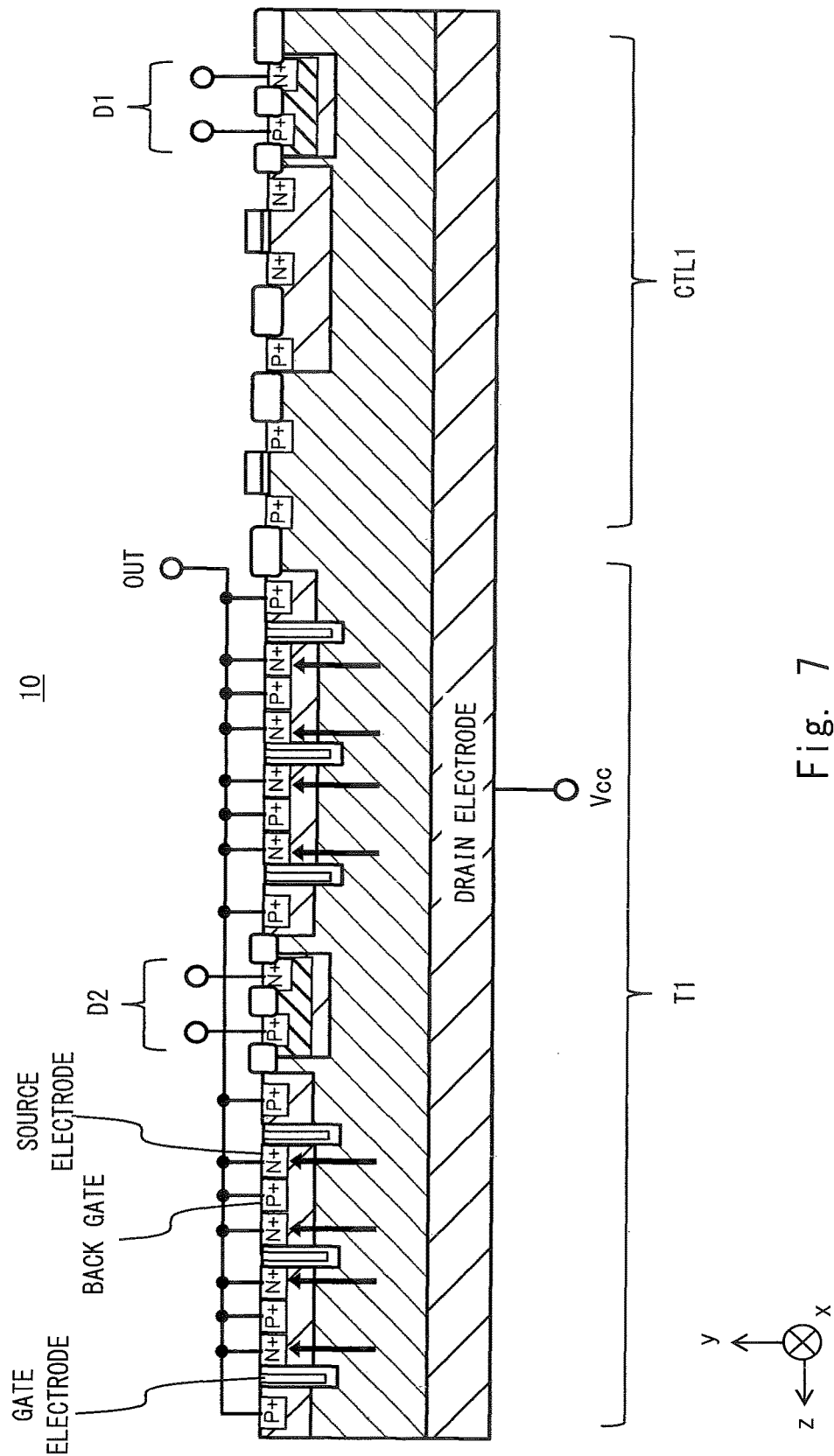
FIG. 7 is a schematic cross-sectional view of the load driving device shown in FIG. 4.
Figure 8:
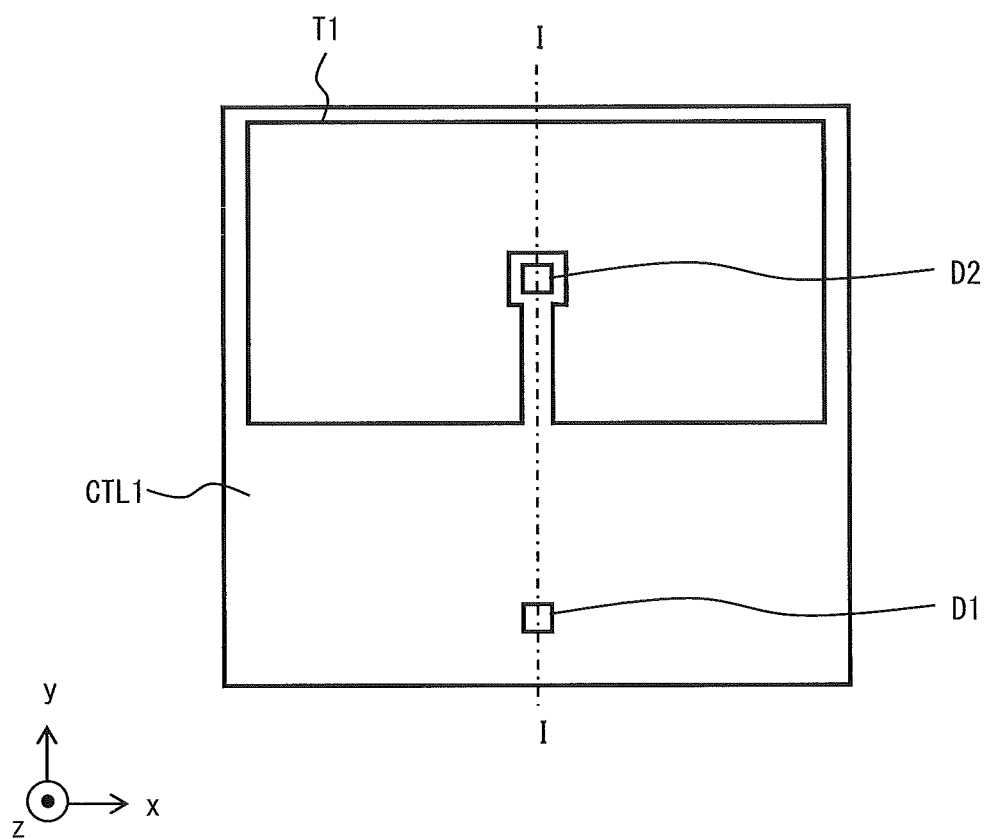
FIG. 8 is a schematic plan view of the load driving device shown in FIG. 4.

FIG. 7 is a schematic cross-sectional view of the load driving device 10. FIG. 8 is a schematic plan view of the load driving device 10. Note that the schematic cross-sectional view of the load driving device 10 shown in FIG. 7 corresponds to the cross-sectional view along line I-I of FIG. 8.

Referring to FIG. 7, the output transistor T1 is composed of a plurality of N-channel MOS transistors connected in parallel. Referring to FIG. 8, in the plan view, the diode D2 (HOT sensor) is placed in a placement region surrounded by the output transistor T1. Thus, the diode D2 is placed in close proximity to the output transistor T1. On the other hand, the diode D1 (COLD sensor) is placed in a peripheral circuit region (control circuit CTL1 region) that is away from the output transistor T1.

As shown in FIG. 6, the resistor elements R1 and R2 are connected in parallel between the constant current source I2 and the diode D2. Further, the switch SW1 is connected in series to the resistor element R2. The switch SW3 is connected in parallel to the switch SW1. The switch SW1 turns on and off based on the temperature difference detection signal dt_ot. For example, the switch SW1 turns off when the temperature difference detection signal dt_ot is inactive (L level) and turns on when the temperature difference detection signal dt_ot is active (H level). The switch SW3 turns on and off based on the over temperature detection signal at_ot. For example, the switch SW3 turns off when the over temperature detection signal at_ot is inactive (L level) and turns on when the over temperature detection signal at_ot is active (H level).

The comparator CMP1 compares a voltage V_H of a node N2 between the constant current source I2 and the resistor element R1 with a voltage V_C between the constant current source I1 and the diode D1 and outputs the temperature difference detection signal dt_ot. For example, when the voltage V_H≥the voltage V_C, the comparator CMP1 sets the temperature difference detection signal dt_ot to inactive (L level), and when the voltage V_H<the voltage V_C, the comparator CMP1 sets the temperature difference detection signal dt_ot to active (H level).

The constant current source I3 and the resistor element R3 are connected between the power supply voltage terminal Vcc and the ground voltage terminal GND.

The comparator CMP2 compares the voltage V_H of the node N2 with a voltage V_R of a node N4 between the constant current source I3 and the resistor element R3 and outputs the over temperature detection signal at_ot. For example, when the voltage V_H≥the voltage V_R, the comparator CMP2 sets the over temperature detection signal at_ot to inactive (L level), and when the voltage V_H<the voltage V_R, the comparator CMP2 sets the over temperature detection signal at_ot to active (H level).

(Specific Operation of Temperature Detector TD1)

The specific operation of the temperature detector TD1 is described hereinafter.

Note that, in the initial state, the voltages are adjusted to satisfy the voltage V_H≥the voltage V_C and the voltage V_H≥the voltage V_R, and therefore both of the temperature difference detection signal dt_ot and the over temperature detection signal at_ot are inactive (L level). Accordingly, the switches SW1 and SW3 are off.

(Temperature Difference Detection Operation by Temperature Detector TD1)

First, the temperature difference detection operation by the temperature detector TD1 is described. Note that the temperature difference detection operation works when the ambient temperature is equal to or lower than the boundary temperature.

When the load is driven by the load driving device 10, the output transistor temperature Ttr starts increasing. A drop voltage of the diode D2 (HOT sensor) thereby decreases, and the voltage V_H decreases accordingly. Then, when the output transistor temperature Ttr further increases to satisfy the voltage V_H<the voltage V_C, the comparator CMP1 sets the temperature difference detection signal dt_ot to active. This means that the temperature difference Tdif between the output transistor temperature Ttr and the ambient temperature becomes larger than the first reference temperature difference Tdref1.

When the temperature difference detection signal dt_ot becomes active, the switch SW1 turns from off to on. The voltage V_H is thereby further lowered. The amount of decrease in the voltage V_H corresponds to the hysteresis ΔTdref.

When the temperature difference detection signal dt_ot becomes active and thereby the output transistor T1 turns off, the output transistor temperature Ttr starts decreasing. A drop voltage of the diode D2 thereby increases, and the voltage V_H increases accordingly. Then, when the output transistor temperature Ttr further decreases to satisfy the voltage V_H≥the voltage V_C, the comparator CMP1 sets the temperature difference detection signal dt_ot to inactive. This means that the temperature difference Tdif between the output transistor temperature Ttr and the ambient temperature becomes equal to or less than the second reference temperature difference Tdref2. Note that the second reference temperature difference Tdref2 is less than the first reference temperature difference Tdref1. A difference between the first reference temperature difference Tdref1 and the second reference temperature difference Tdref2 corresponds to the hysteresis ΔTdref.

(Over Temperature Detection Operation by Temperature Detector TD1)

Next, the over temperature detection operation by the temperature detector TD1 is described. Note that the over temperature detection operation works when the ambient temperature is higher than the boundary temperature.

When the load is driven by the load driving device 10, the output transistor temperature Ttr increases. A drop voltage of the diode D2 thereby decreases, and the voltage V_H decreases accordingly. Then, when the output transistor temperature Ttr further increases to satisfy the voltage V_H<the voltage V_R, the comparator CMP2 sets the over temperature detection signal at_ot to active. This means that the output transistor temperature Ttr becomes higher than the first reference temperature Tref1.

When the over temperature detection signal at_ot becomes active, the switch SW3 turns from off to on. The voltage V_H is thereby further lowered. The amount of decrease in the voltage V_H corresponds to the hysteresis ΔTref1. Note that, although not particularly shown, the temperature difference detection signal dt_ot is controlled to be inactive until the over temperature detection signal at_ot becomes active.

When the over temperature detection signal at_ot becomes active and thereby the output transistor T1 turns off, the output transistor temperature Ttr starts decreasing. A drop voltage of the diode D2 thereby increases, and the voltage V_H increases accordingly. Then, when the output transistor temperature Ttr further decreases to satisfy the voltage V_H≥the voltage V_R, the comparator CMP2 sets the over temperature detection signal at_ot to inactive. This means that the output transistor temperature Ttr becomes equal to or lower than the second reference temperature Tref2. Note that the second reference temperature Tref2 is lower than the first reference temperature Tref1. A difference between the first reference temperature Tref1 and the second reference temperature Tref2 corresponds to the hysteresis ΔTref1.

Because the temperature detector TD1 generates the hysteresis ΔTdref and ΔTref1 by using a common element (resistor element R2) in any case of the temperature difference detection operation and the over temperature detection operation, it is possible to maintain the hysteresis ΔTdref and ΔTref1 at the same value highly accurately in any case of the temperature difference detection operation and the over temperature detection operation. As a result, it is possible to prevent a sudden change in the restoration temperature of the current supply to the load even when the ambient temperature is close to the boundary temperature.

(Timing Chart Showing Operation of Intelligent Power Device 10 in Temperature Difference Detection Operation Range)

Figure 9:
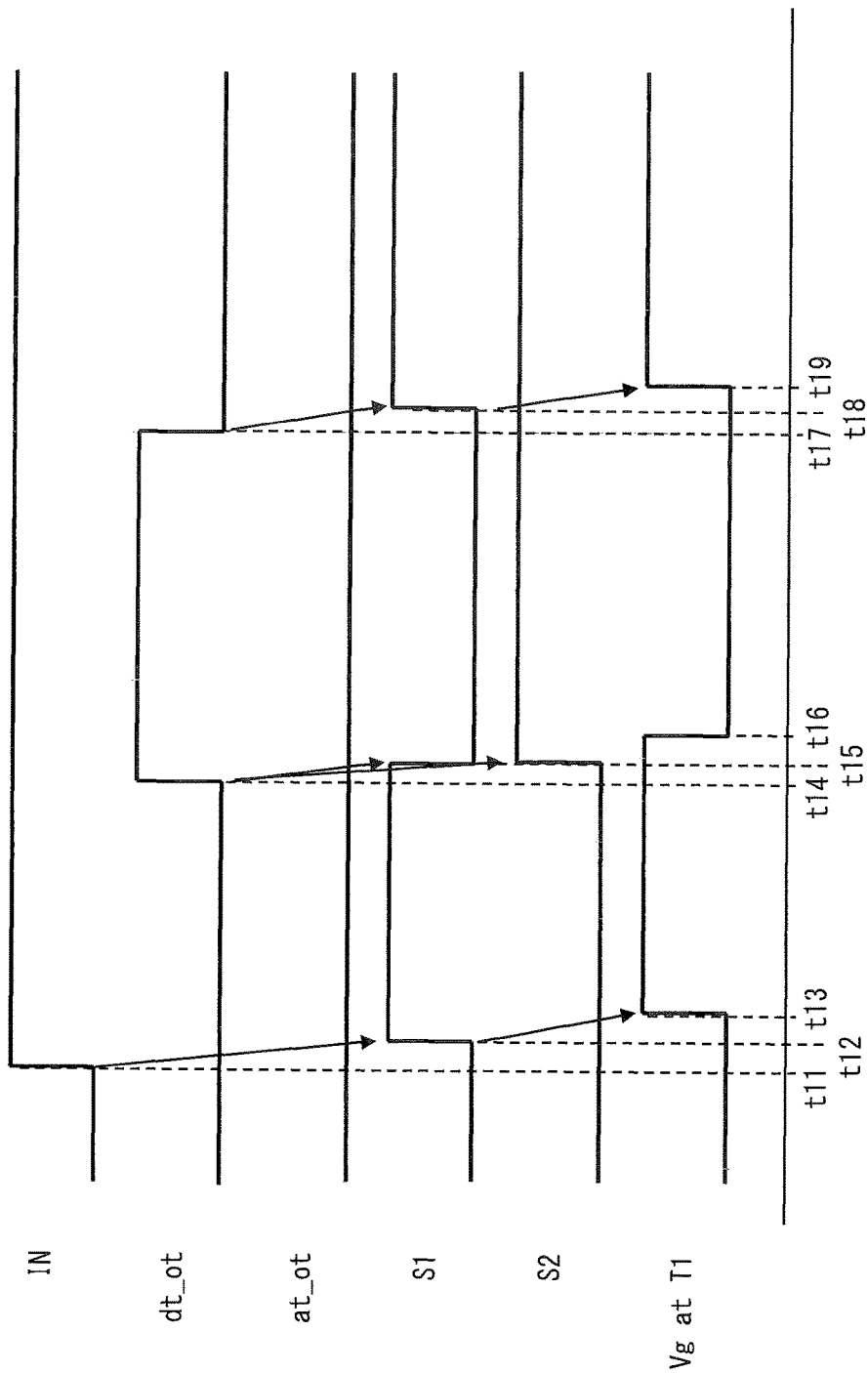
FIG. 9 is a timing chart showing an operation of the load driving device shown in FIG. 4 in the case where an ambient temperature is equal to or lower than a boundary temperature.

FIG. 9 is a timing chart showing the operation of the load driving device 10 in the case where the ambient temperature is equal to or lower than the boundary temperature (which is in the temperature difference detection operation range).

As shown in FIG. 9, when the external input signal IN rises (time t11), the control signal S1 rises accordingly (time t12). The gate voltage Vg of the output transistor T1 thereby rises (time t13), and the output transistor T1 turns on. As a result, a current is supplied to the lamp.

Then, when the temperature difference Tdif between the output transistor temperature Ttr and the ambient temperature becomes more than the first reference temperature difference Tdref1 and thereby the temperature difference detection signal dt_ot rises (time t14), the control signal S1 falls regardless of the external input signal IN (time t15). The gate voltage Vg of the output transistor T1 thereby falls (time t16), and the output transistor T1 turns off regardless of the external input signal IN. As a result, the current supply to the lamp is shut off.

After that, when the temperature difference Tdif between the output transistor temperature Ttr and the ambient temperature becomes equal to or less than the second reference temperature difference Tdref2 and thereby the temperature difference detection signal dt_ot falls (time t17), the control signal S1 rises again (time t18). The gate voltage Vg of the output transistor T1 thereby rises (time t19), and the output transistor T1 turns on again. As a result, the current supply to the lamp is restored.

Note that, when the temperature difference detection signal dt_ot rises (time t14), not only the control signal S1 but also the control signal S2 rises (time t15). Once the control signal S2 rises, it maintains H level without falling even when the temperature difference detection signal dt_ot falls after that (time t17). Accordingly, the current flowing through the output transistor T1 after the restoration of the current supply is limited to the first limited current value, which is lower than in normal times.

(Timing Chart Showing Operation of Intelligent Power Device 10 in Over Temperature Detection Operation Range)

Figure 10:
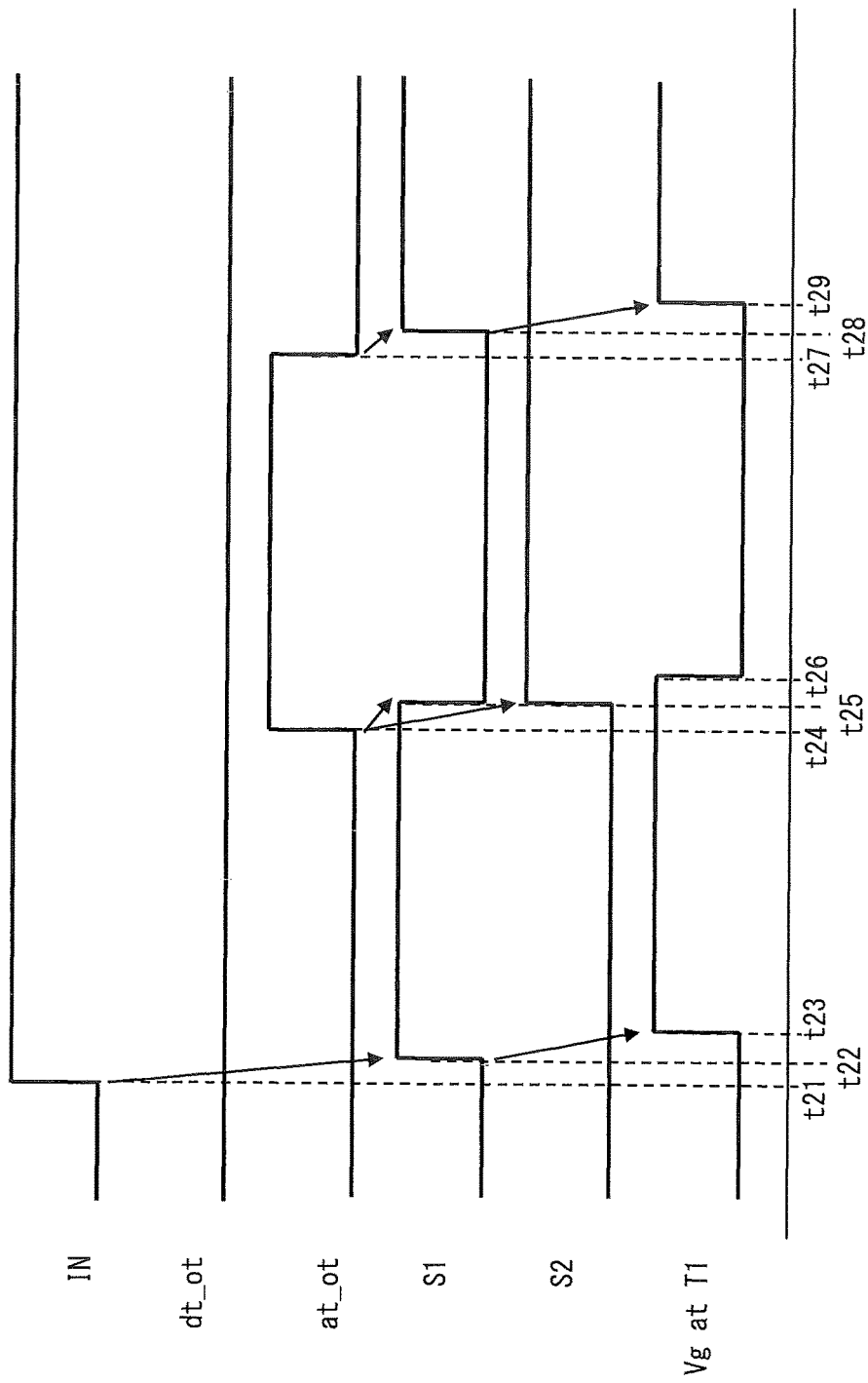
FIG. 10 is a timing chart showing an operation of the load driving device shown in FIG. 4 in the case where an ambient temperature is higher than a boundary temperature.

FIG. 10 is a timing chart showing the operation of the load driving device 10 in the case where the ambient temperature is higher than the boundary temperature (which is in the over temperature detection operation range).

As shown in FIG. 10, when the external input signal IN rises (time t21), the control signal S1 rises accordingly (time t22). The gate voltage Vg of the output transistor T1 thereby rises (time t23), and the output transistor T1 turns on. As a result, a current is supplied to the lamp.

Then, when the output transistor temperature Ttr becomes higher than the first reference temperature Tref1 and thereby the over temperature detection signal at_ot rises (time t24), the control signal S1 falls regardless of the external input signal IN (time t25). The gate voltage Vg of the output transistor T1 thereby falls (time t26), and the output transistor T1 turns off regardless of the external input signal IN. As a result, the current supply to the lamp is shut off.

After that, when the output transistor temperature Ttr becomes equal to or lower than the second reference temperature Tref2 and thereby the over temperature detection signal at_ot falls (time t27), the control signal S1 rises again (time t28). The gate voltage Vg of the output transistor T1 thereby rises (time t29), and the output transistor T1 turns on again. As a result, the current supply to the lamp is restored.

Note that, when the over temperature detection signal at_ot rises (time t24), not only the control signal S1 but also the control signal S2 rises (time t25). Once the control signal S2 rises, it maintains H level without falling even when the over temperature detection signal at_ot falls after that (time t27). Accordingly, the current flowing through the output transistor T1 after the restoration of the current supply is limited to the first limited current value, which is lower than in normal times. In other words, the current flowing through the output transistor T1 after the restoration of the current supply is limited to the first limited current value in any case of the temperature difference detection operation and the over temperature detection operation.

(Relationship Between Shutoff Temperature and Restoration Temperature of Current Supply to Load and Ambient Temperature)

Figure 11:
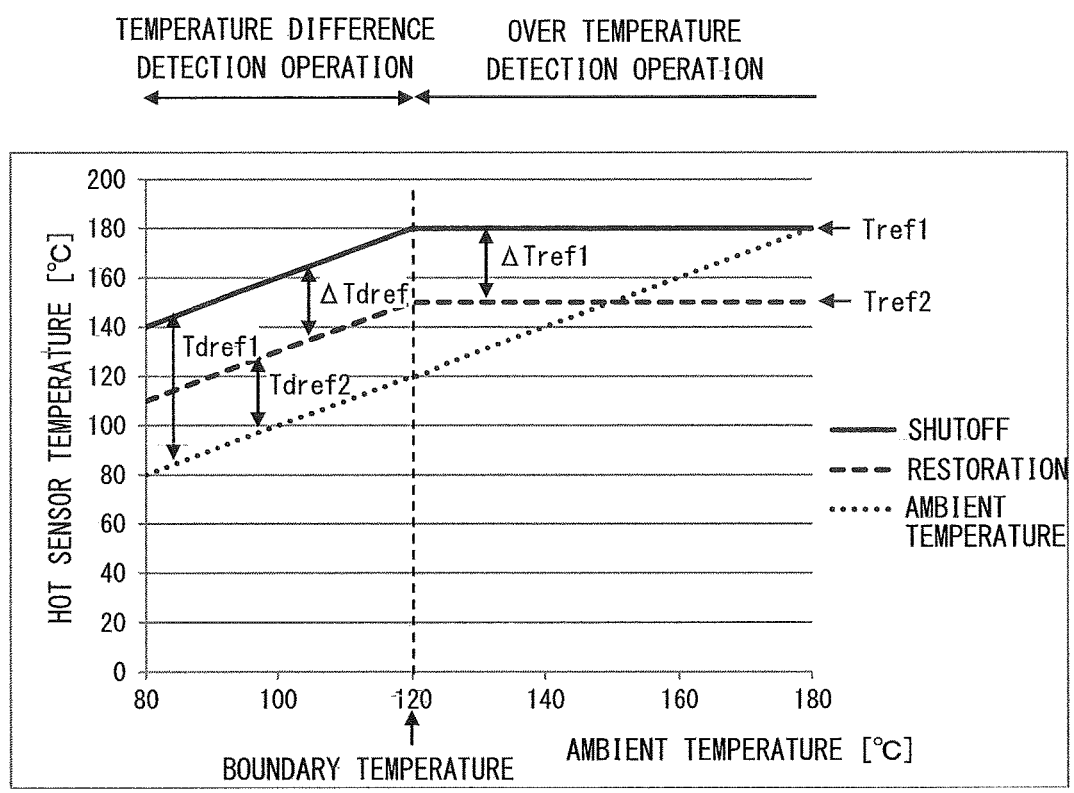
FIG. 11 is a view showing a relationship between a temperature of an output transistor in the load driving device shown in FIG. 4 and an ambient temperature.

FIG. 11 is a view showing a relationship between the temperature (HOT sensor temperature) of the output transistor T1 in the load driving device 10 and the ambient temperature (COLD sensor temperature). The solid line indicates a temperature (shutoff temperature) when the operation of the output transistor T1 stops, and the dotted line indicates a temperature (restoration temperature) when the operation of the output transistor T1 resumes.

The example of FIG. 11 shows the case where the first reference temperature difference Tdref1 is 60° C., the second reference temperature difference Tdref2 is 30° C., the first reference temperature Tref1 is 180° C., and the second reference temperature Tref2 is 150° C. Accordingly, both of the hysteresis ΔTdref of the temperature difference detection signal dt_ot and the hysteresis ΔTref1 of the over temperature detection signal at_ot are 30° C. In the example of FIG. 11, the temperature difference detection operation works when the ambient temperature is equal to or lower than 120° C., and the over temperature detection operation works when the ambient temperature is higher than 120° C.

As shown in FIG. 11, when the ambient temperature is equal to or lower than 120° C., the shutoff temperature (the output transistor temperature Ttr (the temperature of the HOT sensor) when the current supply is shut off) increases with an increase in the ambient temperature. At this time, a difference (Tdref1) between the ambient temperature and the shutoff temperature is constant. On the other hand, when the ambient temperature is higher than 120° C., the shutoff temperature is constant (180° C.) regardless of the ambient temperature. At this time, a difference between the ambient temperature and the shutoff temperature becomes smaller with an increase in the ambient temperature.

The time from when the output transistor temperature Ttr reaches the shutoff temperature to when it returns to the restoration temperature (which is the time required to discharge of the output transistor T1) is represented by the following equation (1). RT indicates thermal resistance, CT indicates heat capacity, and t indicates time.

$$(\text{shutoff temperature} - \text{ambient temperature}) \times \exp\{-t/(RT \cdot CT)\} \quad (1)$$

Thus, the time from when the output transistor temperature Ttr reaches the shutoff temperature to when it returns to the restoration temperature is longer as a temperature difference between the output transistor temperature Ttr and the ambient temperature is smaller, and it is shorter as a temperature difference between the output transistor temperature Ttr and the ambient temperature is larger.

Figure 12:
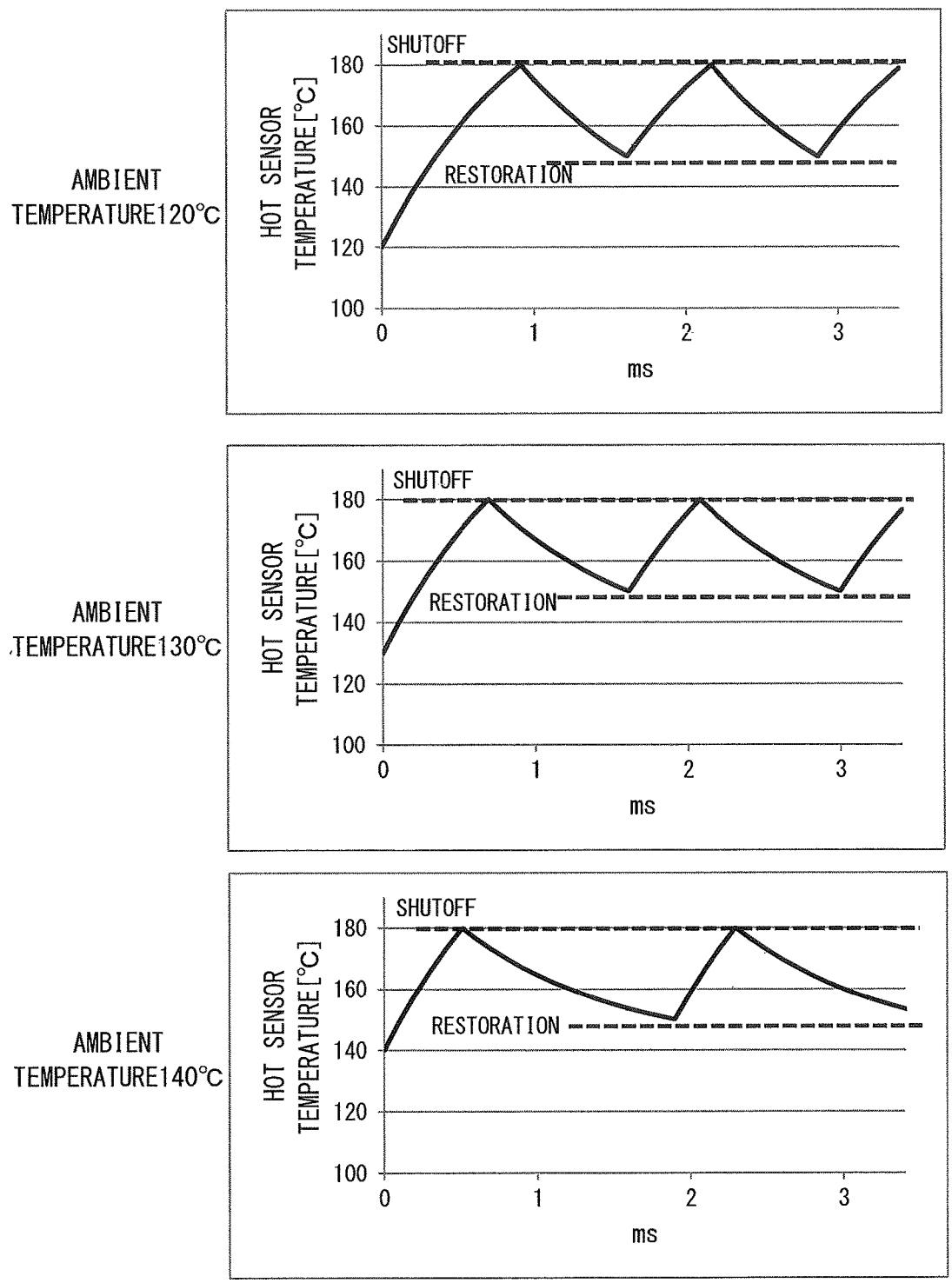
FIG. 12 is a timing chart showing shutoff and restoration of current supply to a load by the load driving device shown in FIG. 4.

FIG. 12 is a timing chart showing the shutoff and the restoration of the current supply to the load by the load driving device 10. FIG. 12 shows a timing chart in each case where the ambient temperature is 120° C., 130° C. and 140° C.

First, when the ambient temperature is 120° C., the time from when the output transistor temperature Ttr reaches the shutoff temperature (180° C.) to when it returns to the restoration temperature (150° C.) is short. Note that, in the temperature difference detection operation range where the ambient temperature is equal to or lower than 120° C., a difference (Tdref1) between the ambient temperature and the shutoff temperature is constant, and therefore the time from when the output transistor temperature Ttr reaches the shutoff temperature (180° C.) to when it returns to the restoration temperature (150° C.) is constant.

Next, when the ambient temperature is 130° C., the time from when the output transistor temperature Ttr reaches the shutoff temperature (180° C.) to when it returns to the restoration temperature (150° C.) is longer than the case where the ambient temperature is equal to or lower than 120° C.

Further, when the ambient temperature is 140° C., the time from when the output transistor temperature Ttr reaches the shutoff temperature (180° C.) to when it returns to the restoration temperature (150° C.) is yet longer than the case where the ambient temperature is 130° C.

In sum, while the time required from the shutoff to the restoration of the current supply is constant regardless of the ambient temperature in the temperature difference detection operation range, the time required from the shutoff to the restoration of the current supply becomes longer with an increase in the ambient temperature in the over temperature detection operation range.

Figure 13:
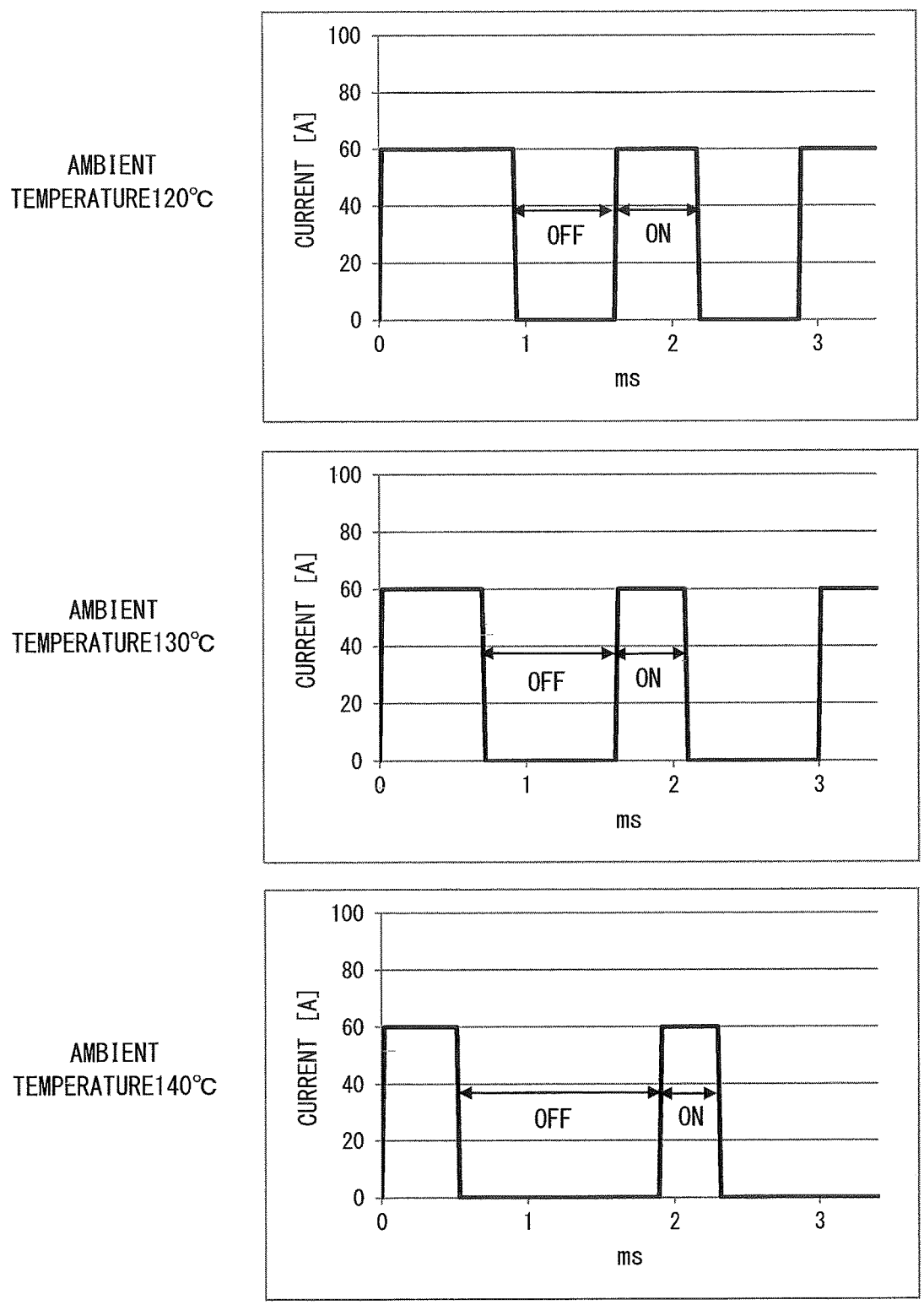
FIG. 13 is a timing chart showing switching of on and off of the output transistor included in the load driving device shown in FIG. 4.

FIG. 13 is a timing chart showing switching of on and off of the output transistor included in the load driving device 10. FIG. 13 shows a timing chart in each case where the ambient temperature is 120° C., 130° C. and 140° C. just like in FIG. 12.

As shown in FIG. 13, when the output transistor temperature Ttr increases to reach the shutoff temperature (180° C.), the output transistor T1 switches from on to off, and when the output transistor temperature Ttr decreases to return to the restoration temperature (150° C.), the output transistor T1 switches from off to on.

Note that, in the temperature difference detection operation range where the ambient temperature is equal to or lower than 120° C., the time required from the shutoff to the restoration of the current supply is constant regardless of the ambient temperature, and therefore the on-duty of the output transistor T1 is constant. On the other hand, in the over temperature detection operation range where the ambient temperature is 130° C., 140° C. and the like, the time required from the shutoff to the restoration of the current supply becomes longer with an increase in the ambient temperature, and therefore the on-duty of the output transistor T1 decreases with an increase in the ambient temperature.

Figure 14:
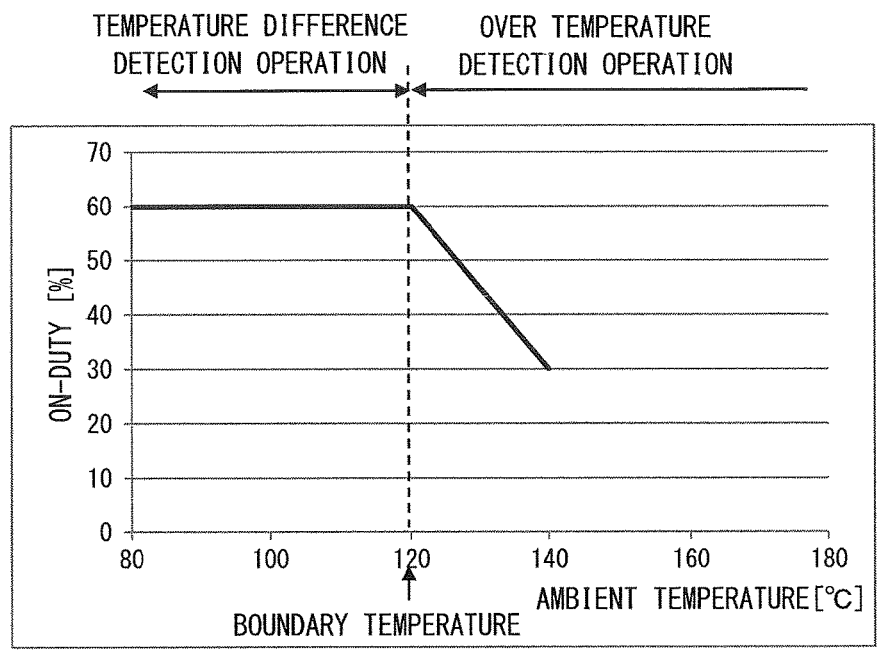
FIG. 14 is a view showing a relationship between an on-duty of the output transistor included in the load driving device shown in FIG. 4 and an ambient temperature.

FIG. 14 is a view showing a relationship between the on-duty of the output transistor T1 and the ambient temperature. FIG. 14 is calculated from FIGS. 12 and 13.

As shown in FIG. 14, while the on-duty of the output transistor T1 is constant regardless of the ambient temperature in the temperature difference detection operation range, the on-duty of the output transistor T1 decreases with an increase in the ambient temperature in the over temperature detection operation range.

Figure 15:
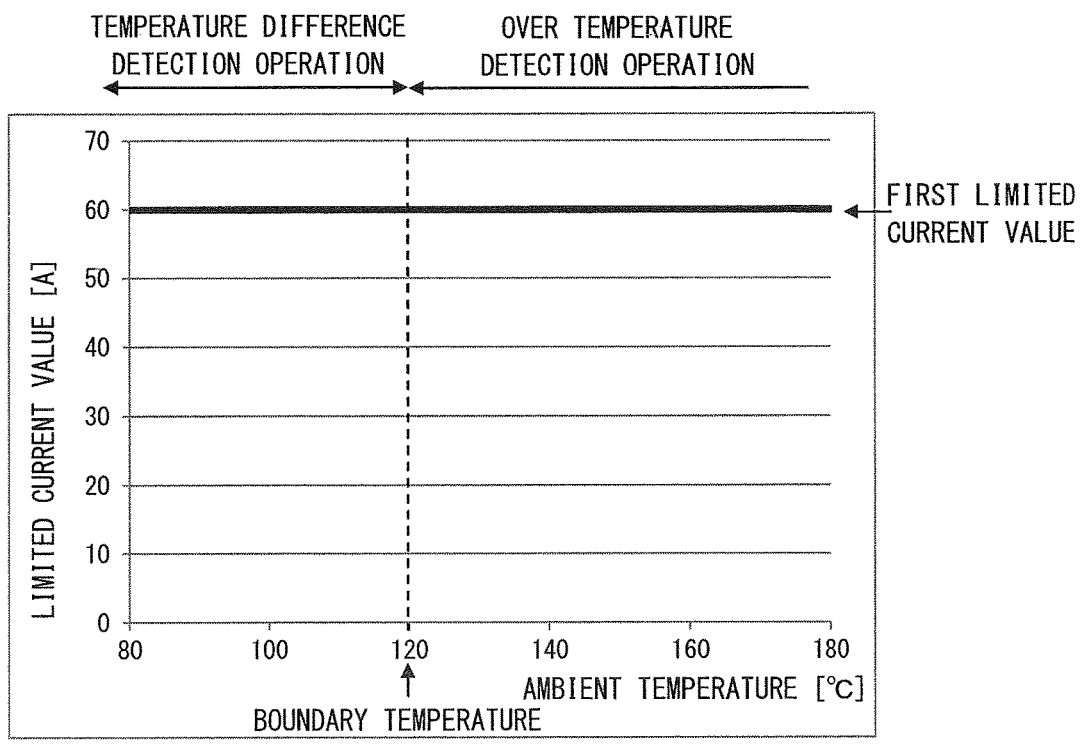
FIG. 15 is a view showing a relationship between a limited current value set by the load driving device shown in FIG. 4 and an ambient temperature.

FIG. 15 is a view showing a relationship between the limited current value set by the load driving device 10 and the ambient temperature.

As shown in FIG. 15, because the current is limited only by the current limiter IL1, the limited current value is 60 A (first limited current value) regardless of the ambient temperature.

The power supplied to the load is determined based on the product of the current flowing through the output transistor T1 and the on-duty of the output transistor T1.

Figure 16:
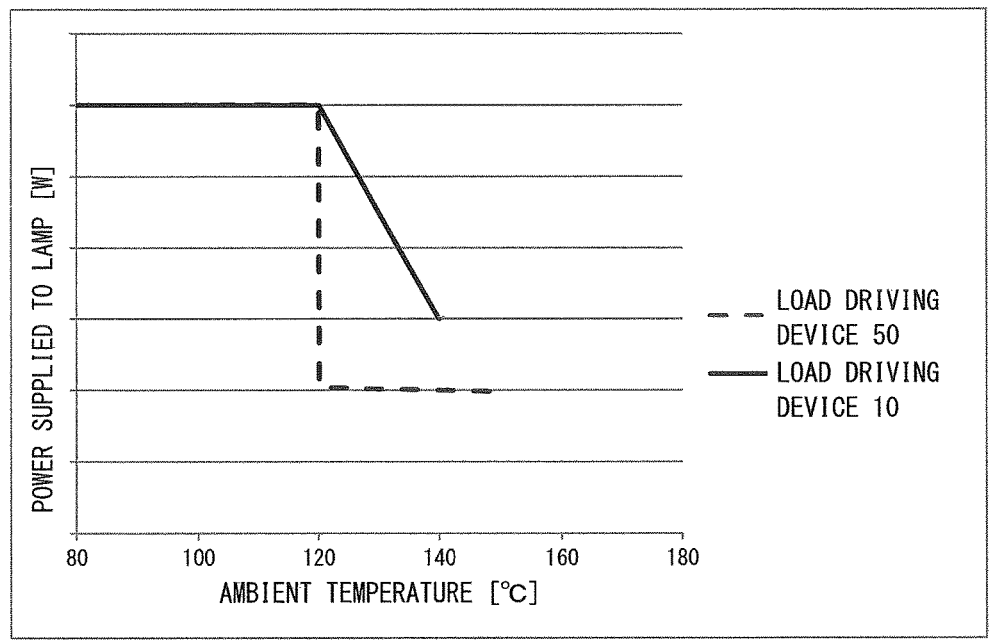
FIG. 16 is a view showing a relationship between a power supplied to a load after restoration of current supply by the load driving device shown in FIG. 4 and an ambient temperature.

FIG. 16 is a view showing a relationship between the power supplied to the load after the restoration of the current supply by the load driving device 10 and the ambient temperature. FIG. 16 is derived from the product of the on-duty shown in FIG. 14 and the limited current value shown in FIG. 15.

As shown in FIG. 16, while the power supplied to the load is constant regardless of the ambient temperature in the temperature difference detection operation range, the power supplied to the load decreases slowly with an increase in the ambient temperature in the over temperature detection operation range.

The load driving device 10 can thereby prevent a sharp decrease in the capability of driving a load even when the over temperature detection operation works due to a slight change in the ambient temperature. As a result, when lighting a lamp, for example, the load driving device 10 can light the lamp stably without a sharp decrease in the driving capability due to the effect of the current at the initial stage of driving.

As described above, the load driving device 10 makes the current flowing through the output transistor T1 after the restoration of the current supply (which is the limited current value) constant in any case of the temperature difference detection operation and the over temperature detection operation, and slowly reduces the power supplied to the load with an increase in the ambient temperature by using the characteristics that the time required for discharge of the output transistor T1 becomes longer as the ambient temperature is higher (in other words, achieves the temperature derating of power supply) in the over temperature detection operation. The load driving device 10 can thereby prevent a sharp decrease in the capability of driving a load even when the over temperature detection operation works due to a slight change in the ambient temperature. As a result, when lighting a lamp, for example, the load driving device 10 can light the lamp stably without a sharp decrease in the driving capability due to the effect of the current at the initial stage of driving.

(Relationship Between Hysteresis and on-Duty Characteristics)

Figure 17:
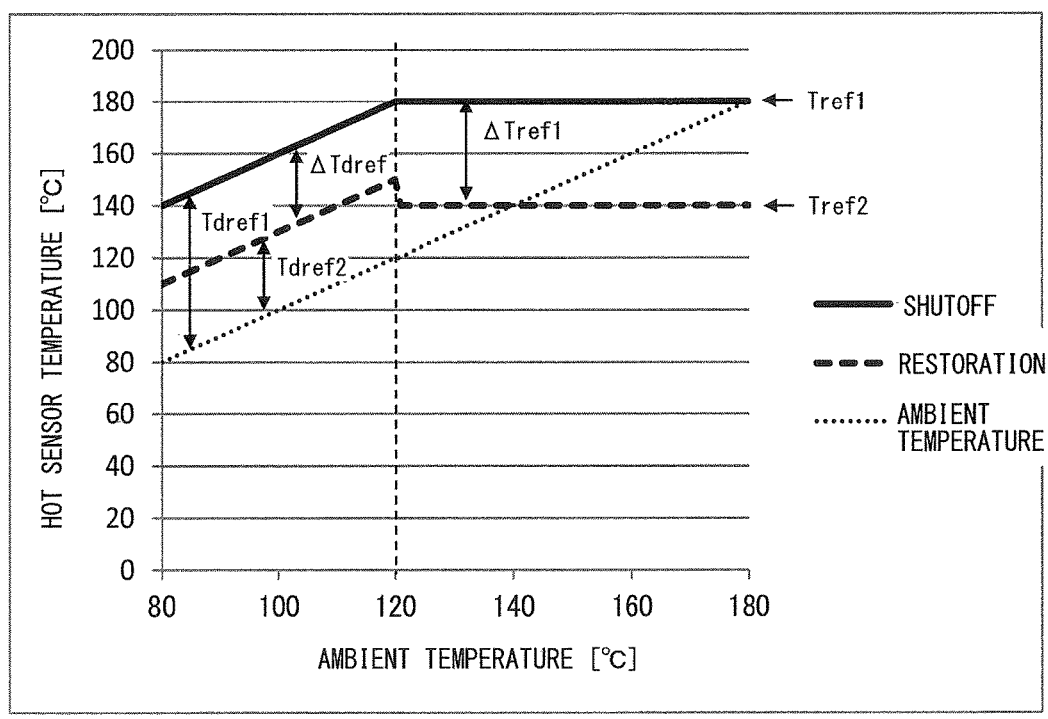
FIG. 17 is a comparative example of FIG. 11 and FIG. 29.

FIG. 17 is a comparative example of FIG. 11 and FIG. 29. FIG. 17 shows the case where the first reference temperature difference Tdref1 is 60° C., the second reference temperature difference Tdref2 is 30° C., the first reference temperature Tref1 is 180° C., and the second reference temperature Tref2 is 140° C. Accordingly, the hysteresis ΔTdref of the temperature difference detection signal dt_ot is 30° C., and the hysteresis ΔTref1 of the over temperature detection signal at_ot is 40° C.

Figure 18:
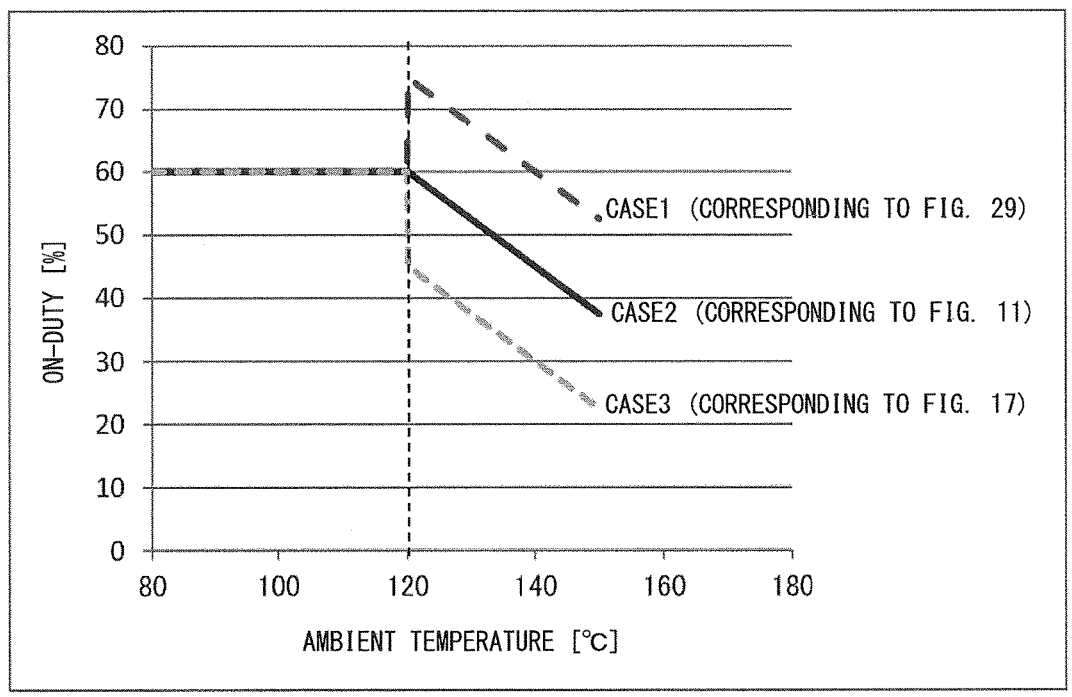
FIG. 18 is a view showing a relationship between an on-duty and an ambient temperature when a hysteresis of an over temperature detection signal is changed.

FIG. 18 is a view showing a relationship between the on-duty and the ambient temperature when the hysteresis ΔTref1 of the over temperature detection signal at_ot is changed. Case 1, Case 2 and Case 3 correspond to the cases of FIG. 25, FIG. 11 and FIG. 17, respectively, As in Case 1, when the on-duty is high when the ambient temperature becomes higher than the boundary temperature, the heating value of the output transistor T1 increases, and therefore the possibility of the breakdown of the output transistor T1 increases. On the other hand, as in Case 2, when the on-duty is low, while the possibility of the breakdown of the output transistor T1 decreases, the driving capability of the output transistor T1 decreases at high temperature. In this embodiment, the hysteresis of the temperature difference detection signal dt_ot and the hysteresis of the over temperature detection signal at_ot are equalized to obtain the characteristics of the on-duty as described in Case 2. It is thereby possible to achieve the compatibility between the protection function and the driving capability of the output transistor.

(Alternative Example of Temperature Detector TD1)

Note that the structure of the temperature detector TD1 is not limited to the above, and it may be appropriately modified to another structure having the same function. An alternative example of the temperature detector TD1 is described hereinafter with reference to FIG. 19.

Figure 19:
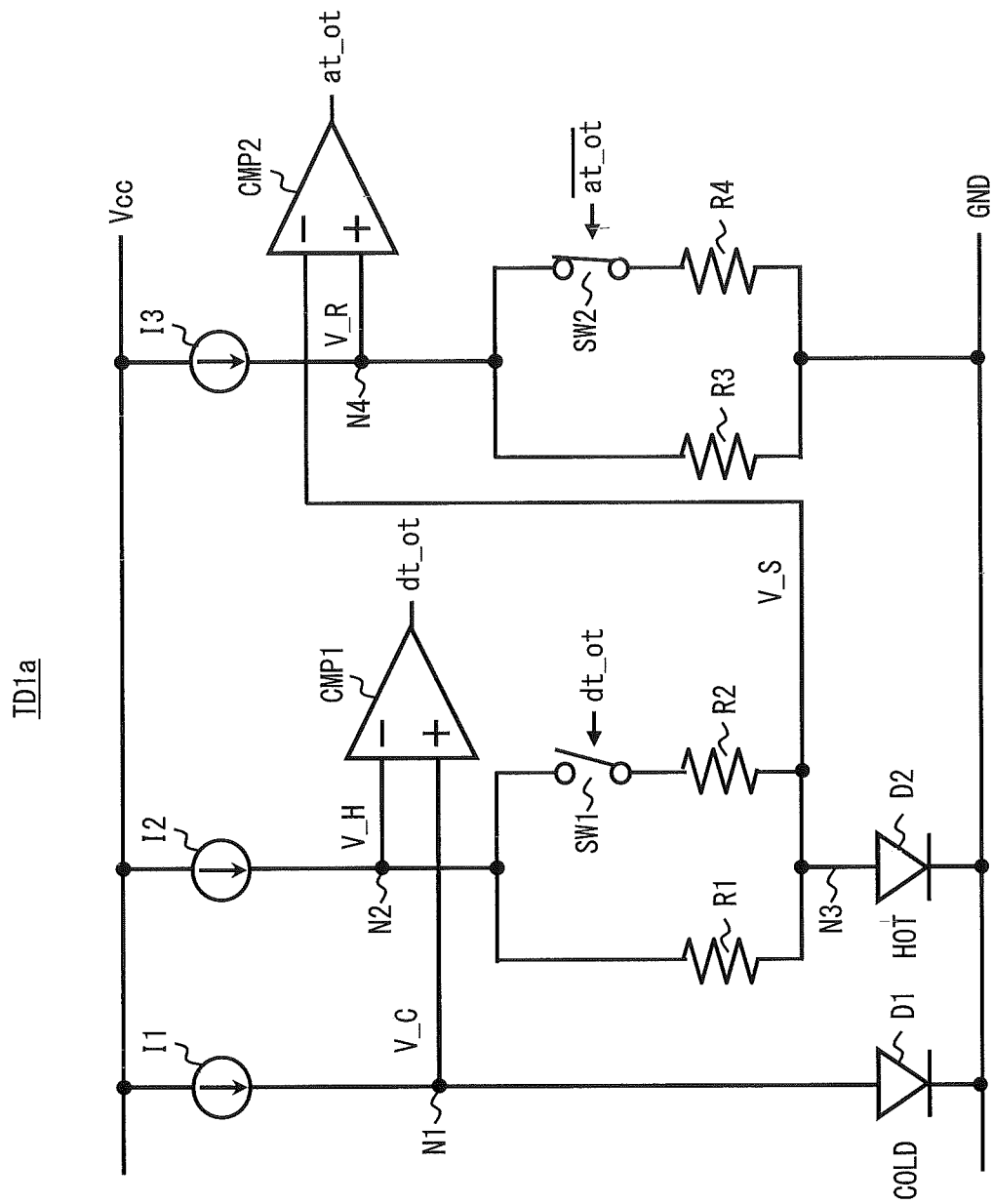
FIG. 19 is a circuit diagram showing an alternative example of the temperature detector shown in FIG. 6.

FIG. 19 is a view showing an alternative example of the temperature detector TD1, which is a temperature detector TD1a. The temperature detector TD1a is different from the temperature detector TD1 in that it does not include the switch SW3 but includes a switch SW2 and a resistor element R4. The switch SW2 is an N-channel MOS transistor, for example.

As shown in FIG. 19, the resistor element R4 is connected in parallel to the resistor element R3. The switch SW2 is connected in series to the resistor element R4. The switch SW2 turns on and off based on the over temperature detection signal at_ot. For example, the switch SW2 turns on when the over temperature detection signal at_ot is inactive (L level) and turns off when the over temperature detection signal at_ot is active (H level).

Further, the comparator CMP2 compares a voltage V_S of a node N3 between the diode D2 and the resistor element R1, instead of the voltage V_H of the node N2, with a voltage V_R of the node N4 and outputs the over temperature detection signal at_ot. For example, when the voltage V_S≥the voltage V_R, the comparator CMP2 sets the over temperature detection signal at_ot to inactive (L level), and when the voltage V_S<the voltage V_R, the comparator CMP2 sets the over temperature detection signal at_ot to active (H level).

The resistance values of the resistor elements R2 and R4 and the like are adjusted, for example, so that the hysteresis ΔTdref and the hysteresis ΔTref1 always have the same value regardless of the ambient temperature.

The other structure of the temperature detector TD1a is the same as that of the temperature detector TD1 and thus not redundantly described.

(Specific Operation of Temperature Detector TD1a)

The specific operation of the temperature detector TD1a is described hereinafter.

Note that, in the initial state, the voltages are adjusted to satisfy the voltage V_H≥the voltage V_C and the voltage V_S≥the voltage V_R, and therefore both of the temperature difference detection signal dt_ot and the over temperature detection signal at_ot are inactive (L level). Accordingly, the switch SW1 is off and the switch SW2 is on.

(Temperature Difference Detection Operation by Temperature Detector TD1a)

First, the temperature difference detection operation by the temperature detector TD1a is described. Note that the temperature difference detection operation works when the ambient temperature is equal to or lower than the boundary temperature.

The temperature difference detection operation by the temperature detector TD1a is the same as the temperature difference detection operation by the temperature detector TD1 and thus not redundantly described.

(Over Temperature Detection Operation by Temperature Detector TD1a)

Next, the over temperature detection operation by the temperature detector TD1a is described. Note that the over temperature detection operation works when the ambient temperature is higher than the boundary temperature.

When the load is driven by the load driving device 10, the output transistor temperature Ttr increases. A drop voltage of the diode D2 (HOT sensor) thereby decreases, and the voltage V_S decreases accordingly. Then, when the output transistor temperature Ttr further increases to satisfy the voltage V_S<the voltage V_R, the comparator CMP2 sets the over temperature detection signal at_ot to active. This means that the output transistor temperature Ttr becomes higher than the first reference temperature Tref1.

When the over temperature detection signal at_ot becomes active, the switch SW2 turns from on to off. The voltage V_R thereby becomes higher. The amount of increase in the voltage V_R corresponds to the hysteresis ΔTref1.

When the over temperature detection signal at_ot becomes active and thereby the output transistor T1 turns off, the output transistor temperature Ttr starts decreasing. A drop voltage of the diode D2 thereby increases, and the voltage V_S increases accordingly. Then, when the output transistor temperature Ttr further decreases to satisfy the voltage V_S≥the voltage V_R, the comparator CMP2 sets the over temperature detection signal at_ot to inactive. This means that the output transistor temperature Ttr becomes equal to or lower than the second reference temperature Tref2. Note that the second reference temperature Tref2 is lower than the first reference temperature Tref1. A difference between the first reference temperature Tref1 and the second reference temperature Tref2 corresponds to the hysteresis ΔTref1.

In the temperature detector TD1a, by adjustment of the resistance values of the resistor elements R2 and R4 and the like, the hysteresis ΔTdref and the hysteresis ΔTref1 are maintained at the same value in any case of the temperature difference detection operation and the over temperature detection operation. As a result, it is possible to prevent a sudden change in the restoration temperature of the current supply to the load even when the ambient temperature is close to the boundary temperature. Note that, however, because the temperature detector TD1 shown in FIG. 6 generates the hysteresis ΔTdref and ΔTref1 by using a common element (resistor element R2), it is possible to maintain the hysteresis ΔTdref and ΔTref1 at the same value more accurately than the temperature detector TD1a.

Second Embodiment

Figure 20:
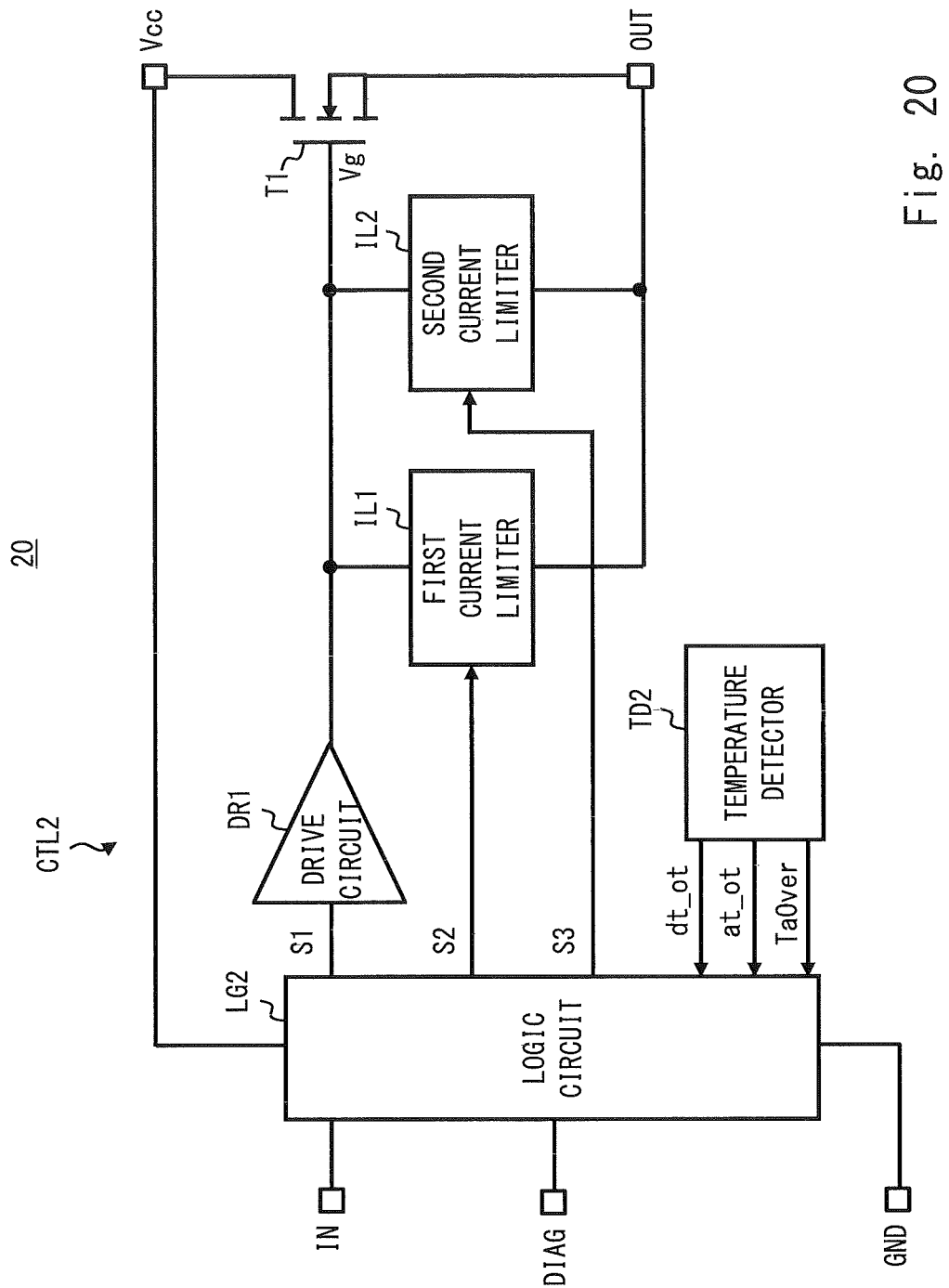
FIG. 20 is a block diagram showing a structure of a load driving device according to a second embodiment.

FIG. 20 is a block diagram showing a structure of a load driving device 20 according to a second embodiment.

As shown in FIG. 20, the load driving device 20 is different from the load driving device 10 in that it includes a temperature detector TD2 and a logic circuit LG2 in place of the temperature detector TD1 and the logic circuit LG1 and further includes a current limiter (second current limiter) IL2. Note that the temperature detector TD2, the logic circuit LG2, the drive circuit DR1 and the current limiters IL1 and IL2 constitute a control circuit CTL2.

When the temperature difference Tdif between the output transistor temperature Ttr and the ambient temperature becomes more than the first reference temperature difference Tdref1, the temperature detector TD2 determines that the temperature difference Tdif between the output transistor temperature Ttr and the ambient temperature is excessive and sets the temperature difference detection signal dt_ot to active (from L level to H level, for example). After that, when the temperature difference Tdif between the output transistor temperature Ttr and the ambient temperature becomes equal to or less than the second reference temperature difference Tdref2 (=Tdref1−ΔTdref), the temperature detector TD2 sets the temperature difference detection signal dt_ot back to inactive (from H level to L level, for example).

Further, when the output transistor temperature Ttr becomes higher than the first reference temperature Tref1, the temperature detector TD2 determines that the output transistor temperature Ttr is overheating and sets the over temperature detection signal at_ot to active (from L level to H level, for example).

Further, when the ambient temperature becomes higher than a second boundary temperature (where the boundary temperature<the second boundary temperature<the first reference temperature Tref1), the temperature detector TD2 sets an over temperature detection signal (third detection signal) TaOver to active (from L level to H level, for example). It is thereby possible to recognize whether the over temperature detection operation works at a low ambient temperature or the over temperature detection operation works at a high ambient temperature.

When the over temperature detection signal TaOver is inactive and the over temperature detection signal at_ot is active, the temperature detector TD2 sets the over temperature detection signal at_ot back to inactive (from H level to L level, for example) when the output transistor temperature Ttr decreases to be equal to or lower than the second reference temperature Tref2 (=Tref1−ΔTref1) after that.

Then, when both of the over temperature detection signals TaOver and at_ot become active, the temperature detector TD2 sets the over temperature detection signal at_ot back to inactive (from H level to L level, for example) when the output transistor temperature Ttr decreases to be equal to or lower than a third reference temperature Tref3, which is higher than the second reference temperature Tref2 after that. A difference between the first reference temperature Tref1 and the third reference temperature Tref3 corresponds to a hysteresis ΔTref2.

Figure 21:
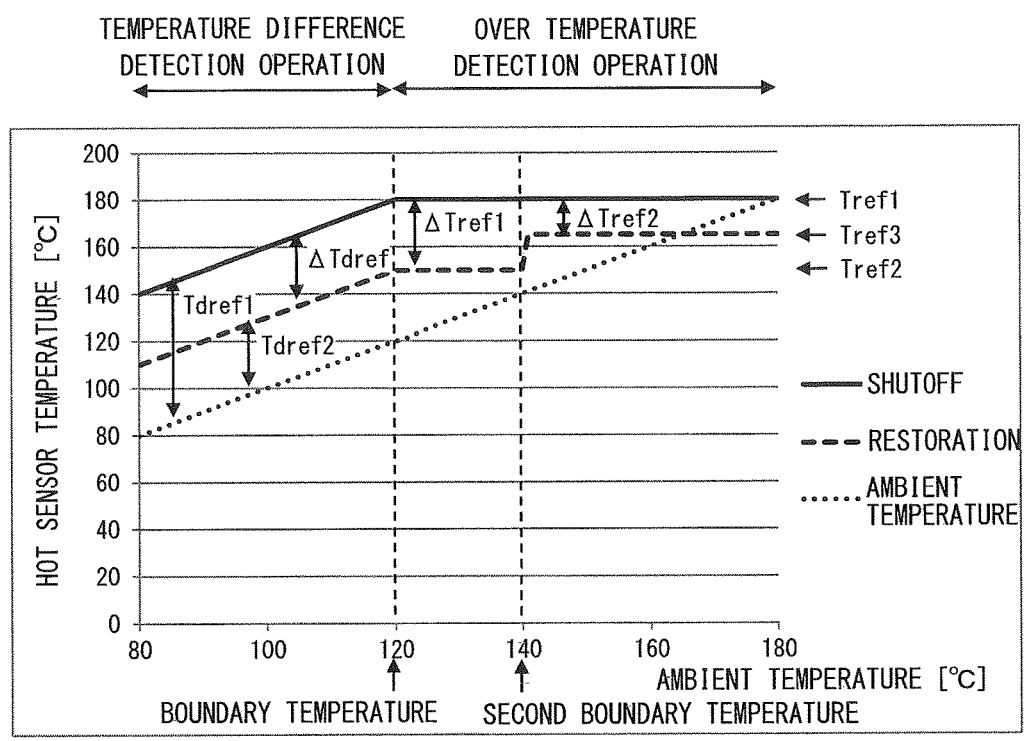
FIG. 21 is a view showing a relationship between a temperature of an output transistor in the load driving device shown in FIG. 20 and an ambient temperature.

FIG. 21 is a view showing a relationship between the temperature (HOT sensor temperature) of the output transistor T1 in the load driving device 20 and the ambient temperature (COLD sensor temperature). The solid line indicates a temperature (shutoff temperature) when the operation of the output transistor T1 stops, and the dotted line indicates a temperature (restoration temperature) when the operation of the output transistor T1 resumes.

The example of FIG. 21 shows the case where the first reference temperature difference Tdref1 is 60° C., the second reference temperature difference Tdref2 is 30° C., the first reference temperature Tref1 is 180° C., the second reference temperature Tref2 is 160° C., and the third reference temperature Tref3 is 175° C. Accordingly, the hysteresis ΔTdref is 30° C., the hysteresis ΔTref1 is 30° C., and the hysteresis ΔTref2 is 15° C. In the example of FIG. 21, the temperature difference detection operation works when the ambient temperature is equal to or lower than 120° C., and the over temperature detection operation works when the ambient temperature is higher than 120° C.

At the ambient temperature in the range where the over temperature detection operation works and which is equal to or lower than the second boundary temperature (=140° C.), the hysteresis ΔTref1 is 30° C., and at the ambient temperature in the range where the over temperature detection operation works and which is higher than the second boundary temperature (=140° C.), the hysteresis ΔTref2 is 15° C., which is lower than the hysteresis ΔTref1.

The logic circuit LG2 outputs a control signal S1 corresponding to the external input signal IN supplied from the outside. The control signal S1 is driven by the drive circuit DR1 and then supplied to the gate of the output transistor T1.

Note that, when any one of the temperature difference detection signal dt_ot and the over temperature detection signal at_ot output from the temperature detector TD2 becomes active, the logic circuit LG2 sets the control signal S1 to inactive (L level) regardless of the external input signal IN. The output transistor T1 thereby turns off regardless of the external input signal IN. After that, when both of the temperature difference detection signal dt_ot and the over temperature detection signal at_ot output from the temperature detector TD2 become inactive, the logic circuit LG2 starts outputting the control signal S1 corresponding to the external input signal IN again.

The logic circuit LG2 further outputs control signals S2 and S3. To be specific, when any one of the temperature difference detection signal dt_ot and the over temperature detection signal at_ot becomes active, the logic circuit LG2 sets the control signal S2 to active (H level). The control signal S2 is supplied to the current limiter IL1. Further, when both of the over temperature detection signals at_ot and TaOver become active, the logic circuit LG2 sets the control signal S3 to active (H level). The control signal S3 is supplied to the current limiter IL2.

The current limiters IL1 and IL2 limit the current flowing through the output transistor T1 after the restoration of the current supply to a lower current value than in normal times when the control signals S2 and S3 are active, respectively.

For example, when an excessive temperature difference is detected by the temperature difference detection operation (when the temperature difference detection signal dt_ot becomes active) and when an over temperature is detected by the over temperature detection operation at a relatively low ambient temperature (when the over temperature detection signal at_ot is active and the over temperature detection signal TaOver is inactive), the current limit is made by the current limiter IL1 only, and therefore the limited current value is limited to a first limited current value. On the other hand, when an over temperature is detected by the over temperature detection operation at a relatively high ambient temperature (when both of the over temperature detection signals at_ot and TaOver are active), the current limit is made by both of the current limiters IL1 and IL2, and therefore the limited current value is limited to a second limited current value, which is lower than the first limited current value.

To be specific, each of the current limiters IL1 and IL2 respectively has switching elements that are connected in series between the gate and the source of the output transistor T1, and turns on the switch when the control signals S2 and S3 are active and thereby makes the gate and the source of the output transistor T1 conducting through a specified resistor component. Note that the logic circuit LG2 has a function of latching the control signals S2 and S3, and once the temperature difference detection signal dt_ot and the over temperature detection signal at_ot become active and thereby the control signals S2 and S3 become active, even when the temperature difference detection signal dt_ot and the over temperature detection signal at_ot become inactive after that, the control signals S2 and S3 are kept active. Therefore, each of the current limiters IL1 and IL2 keeps limiting the current flowing through the output transistor T1.

Figure 22:
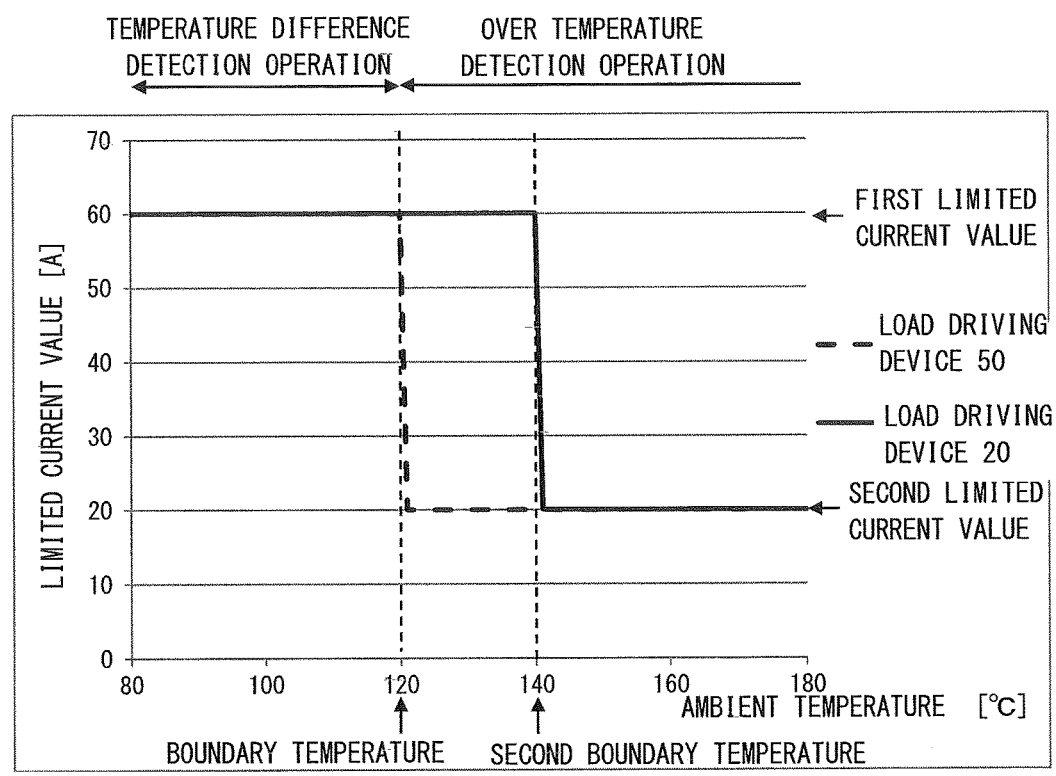
FIG. 22 is a view showing a relationship between a limited current value set by the load driving device shown in FIG. 20 and an ambient temperature.

FIG. 22 is a view showing a relationship between the limited current value set by the load driving device 20 and the ambient temperature.

Referring to FIG. 22, when the ambient temperature is equal to or lower than 140° C. (the second boundary temperature), the current limit is made by the current limiter IL1 only, and therefore the limited current value is 60 A (the first limited current value). On the other hand, when the ambient temperature is higher than 140° C., the current limit is made by both of the current limiters IL1 and IL2, and therefore the limited current value is 20A (the second limited current value). In other words, at the ambient temperature where the temperature difference detection operation works and at the ambient temperature where the over temperature detection operation works and which is relatively low, the limited current value is limited to the first limited current value, and at the ambient temperature where the over temperature detection operation works and which is relatively high, the limited current value is limited to the second limited current value, which is lower than the first limited current value.

Figure 23:
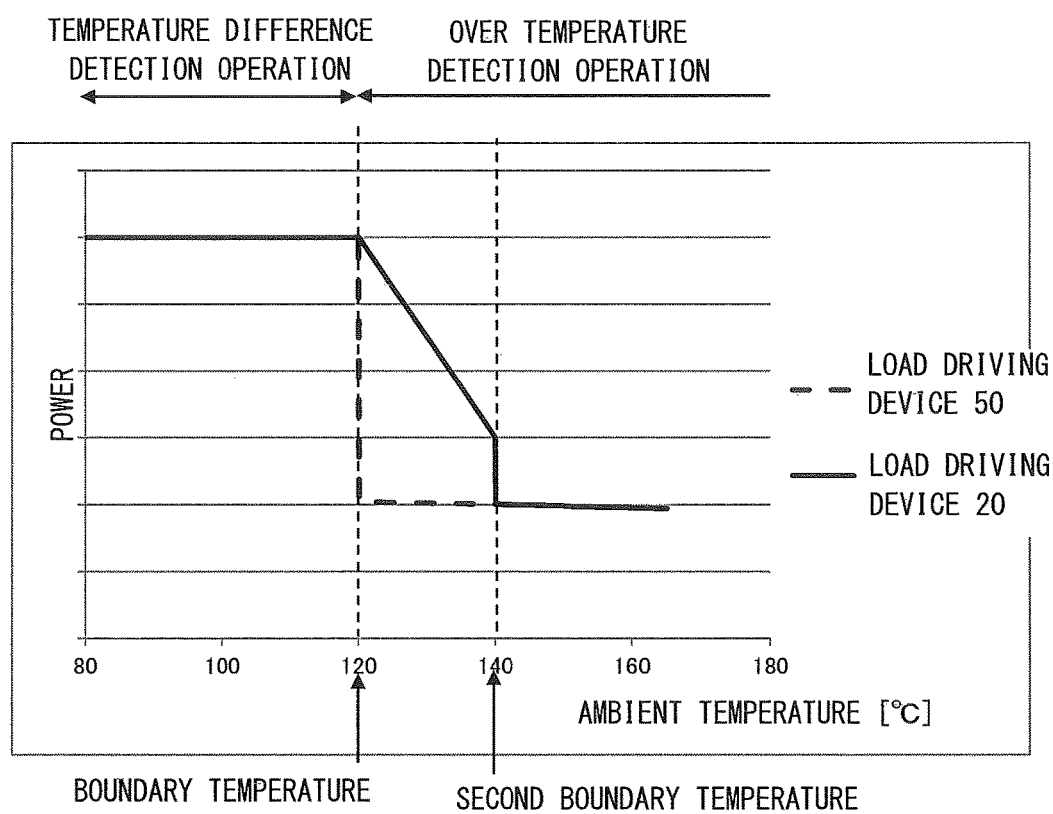
FIG. 23 is a view showing a relationship between a power supplied to a load by the load driving device shown in FIG. 20 and an ambient temperature.

FIG. 23 is a view showing a relationship between the power supplied to a load and the ambient temperature.

Referring to FIG. 23, during the temperature difference detection operation (when the ambient temperature≤the boundary temperature), a fixed power corresponding to the first limited current value is supplied. During the over temperature detection operation at a relatively low ambient temperature (to be more specific, the boundary temperature<the ambient temperature≤the second boundary temperature), the limited current value is kept at the first limited current value; however, because the on-duty of the output transistor T1 decreases as the ambient temperature becomes higher, the power supplied to the load decreases with an increase in the ambient temperature. During the over temperature detection operation at a relatively high ambient temperature (to be more specific, the second boundary temperature<the ambient temperature), a low fixed power corresponding to the second limited current value is supplied.

As described above, in the temperature difference detection operation and in the over temperature detection operation at a relatively low ambient temperature, the load driving device 20 performs the same operation as the load driving device 10, and in the over temperature detection operation at a relatively high ambient temperature, the load driving device 20 reduces the hysteresis between the shutoff temperature and the restoration temperature of the current supply and sets the limited current value to very low. The load driving device 20 thereby has the same advantageous effects as the load driving device 10 in the temperature difference detection operation and in the over temperature detection operation at a relatively low ambient temperature, and reduces the possibility that the ambient temperature becomes higher than the restoration temperature to cause a failure in the restoration of the current supply in the over temperature detection operation at a relatively high ambient temperature.

(Specific Structure of Temperature Detector TD2)

Figure 24:
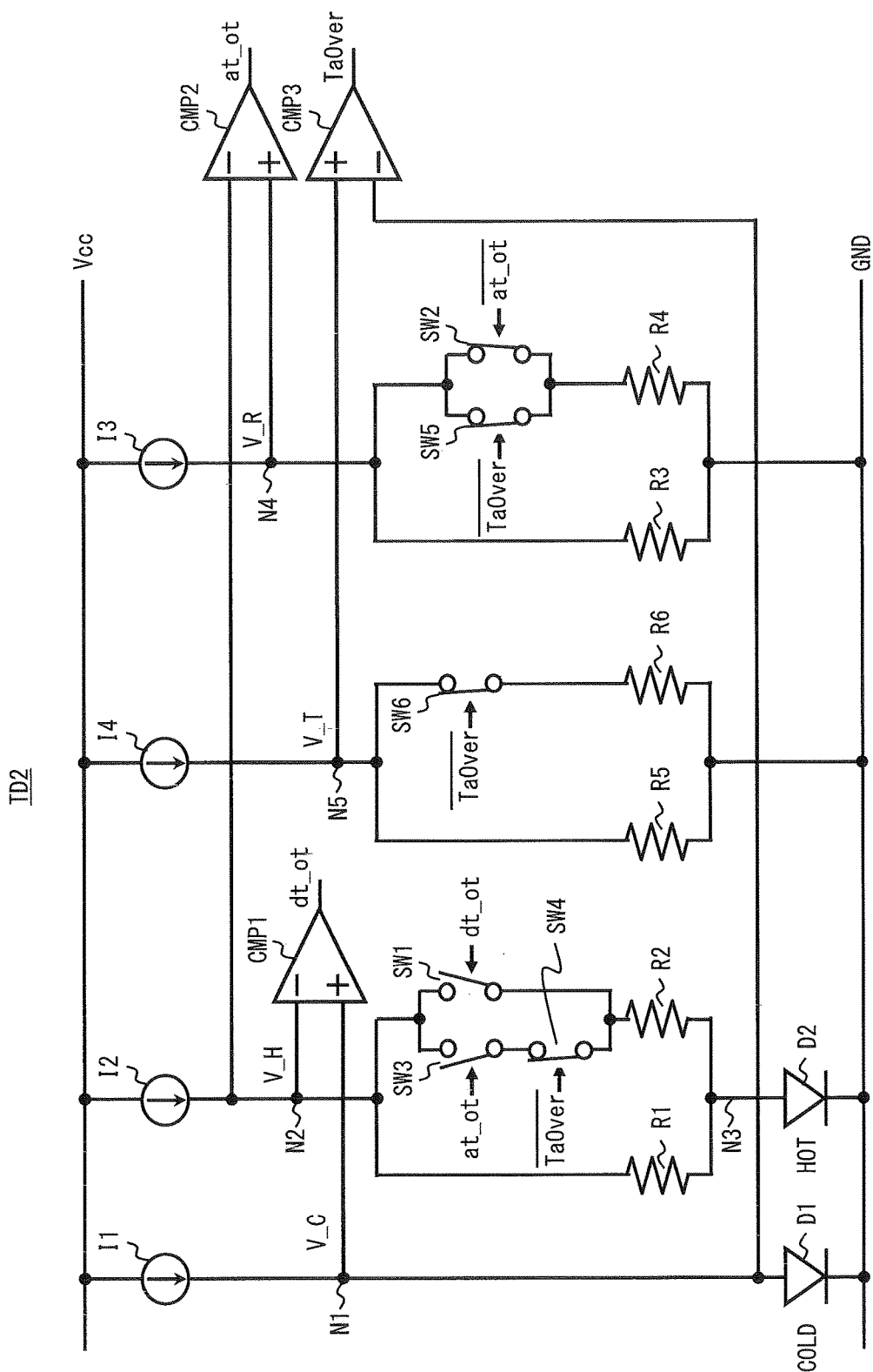
FIG. 24 is a circuit diagram showing a structure of a temperature detector included in the load driving device shown in FIG. 20.

The temperature detector TD2 is described in detail hereinbelow. FIG. 24 is a circuit diagram showing the specific structure of the temperature detector TD2.

As shown in FIG. 24, the temperature detector TD2 includes constant current sources I1 to I4, diodes D1 and D2, resistor elements R1 to R6, switches SW1 and SW6, and comparators CMP1 and CMP3. The switches SW1 to SW6 are N-channel MOS transistors, for example.

The constant current source I1 and the diode D1 (COLD sensor) are connected in series between a power supply voltage terminal Vcc and a ground voltage terminal GND.

The constant current source I2 and the diode D2 (HOT sensor) are connected in series between the power supply voltage terminal Vcc and the ground voltage terminal GND. The resistor elements R1 and R2 are connected in parallel between the constant current source I2 and the diode D2. Further, the switch SW1 is connected in series to the resistor element R2. The switch SW3 is connected in parallel to the switch SW1. The switch SW4 is connected in series to the switch SW3.

The switch SW1 turns on and off based on the temperature difference detection signal dt_ot. For example, the switch SW1 turns off when the temperature difference detection signal dt_ot is inactive (L level) and turns on when the temperature difference detection signal dt_ot is active (H level). The switch SW3 turns off when the over temperature detection signal at_ot is inactive (L level) and turns on when the over temperature detection signal at_ot is active (H level). The switch SW4 turns on when the over temperature detection signal TaOver is inactive (L level) and turns off when the over temperature detection signal TaOver is active (H level).

The comparator CMP1 compares a voltage V_H of a node N2 between the constant current source I2 and the resistor element R1 with a voltage V_C between the constant current source I1 and the diode D1 and outputs the temperature difference detection signal dt_ot. For example, when the voltage V_H≥the voltage V_C, the comparator CMP1 sets the temperature difference detection signal dt_ot to inactive (L level), and when the voltage V_H<the voltage V_C, the comparator CMP1 sets the temperature difference detection signal dt_ot to active (H level).

The resistor elements R3 and R4 are connected in parallel between the constant current source I3 and the ground voltage terminal GND. Further, the switch SW2 is connected in series to the resistor element R4. The switch SW5 is connected in parallel to the switch SW2. The switch SW2 turns on and off based on the over temperature detection signal at_ot. For example, the switch SW2 turns on when the over temperature detection signal at_ot is inactive (L level) and turns off when the over temperature detection signal at_ot is active (H level). The switch SW5 turns on and off based on the over temperature detection signal TaOver. For example, the switch SW5 turns on when the over temperature detection signal TaOver is inactive (L level) and turns off when the over temperature detection signal TaOver is active (H level).

The comparator CMP2 compares the voltage V_H of the node N2 with a voltage V_R of a node N4 between the constant current source I3 and the resistor element R3 and outputs the over temperature detection signal at_ot. For example, when the voltage V_H≥the voltage V_R, the comparator CMP2 sets the over temperature detection signal at_ot to inactive (L level), and when the voltage V_H<the voltage V_R, the comparator CMP2 sets the over temperature detection signal at_ot to active (H level).

The resistor elements R5 and R6 are connected in parallel between the constant current source I4 and the ground voltage terminal GND. Further, the switch SW6 is connected in series to the resistor element R6. The switch SW6 turns on and off based on the over temperature detection signal TaOver. For example, the switch SW6 turns on when the over temperature detection signal TaOver is inactive (L level) and turns off when the over temperature detection signal TaOver is active (H level).

The comparator CMP3 compares the voltage V_C of the node N1 with a voltage V_T of a node N5 between the constant current source I4 and the resistor element R5 and outputs the over temperature detection signal TaOver. For example, when the voltage V_C≥the voltage V_T, the comparator CMP3 sets the over temperature detection signal TaOver to inactive (L level), and when the voltage V_C<the voltage V_T, the comparator CMP3 sets the over temperature detection signal TaOver to active (H level).

(Specific Operation of Temperature Detector TD2)

The specific operation of the temperature detector TD2 is described hereinafter.

Note that, in the initial state, the voltages are adjusted to satisfy the voltage V_H≥the voltage V_C, the voltage V_H≥the voltage V_R, and the voltage V_C≥the voltage V_T, and therefore all of the temperature difference detection signal dt_ot and the over temperature detection signals at_ot and TaOver are inactive (L level). Accordingly, the switches SW1 and SW3 are off, and the switches SW2, SW4, SW5 and SW6 are on.

(Temperature Difference Detection Operation by Temperature Detector TD2)

First, the temperature difference detection operation by the temperature detector TD2 is described. Note that the temperature difference detection operation works when the ambient temperature is equal to or lower than the boundary temperature.

The temperature difference detection operation by the temperature detector TD2 is the same as the temperature difference detection operation by the temperature detector TD1 and thus not redundantly described.

(Over Temperature Detection Operation by Temperature Detector TD2)

Next, the over temperature detection operation by the temperature detector TD2 is described. Note that the over temperature detection operation works when the ambient temperature is higher than the boundary temperature.

First, the over temperature detection operation at a relatively low ambient temperature (to be more specific, the boundary temperature<the ambient temperature≤the second boundary temperature) is described hereinafter.

At the boundary temperature<the ambient temperature≤the second boundary temperature, a drop voltage of the diode D1 is not so low, and therefore the voltage V_C does not decrease so much, and the relationship of the voltage V_C≥the voltage V_T is maintained. Accordingly, the comparator CMP3 keeps the over temperature detection signal TaOver inactive. All of the switches SW4 to SW6 thereby turn on. As a result, the over temperature detection operation by the temperature detector TD2 at this time is substantially the same as the over temperature detection operation by the temperature detector TD1.

To be specific, when the output transistor temperature Ttr increases by driving the load, a drop voltage of the diode D2 decreases, and the voltage V_H decreases accordingly.

Then, when the output transistor temperature Ttr further increases to satisfy the voltage V_H<voltage V_R, the comparator CMP2 sets the over temperature detection signal at_ot to active. This means that the output transistor temperature Ttr becomes higher than the first reference temperature Tref1.

When the over temperature detection signal at_ot becomes active, the switch SW2 turns from on to off, and the switch SW3 turns from off to on. While the voltage V_R does not change even when the switch SW2 turns off because the switch SW5 is on, the voltage V_H further decreases when the switch SW3 turns on. The amount of decrease in the voltage V_H corresponds to the hysteresis ΔTref1.

When the over temperature detection signal at_ot becomes active and thereby the output transistor T1 turns off, the output transistor temperature Ttr starts decreasing. A drop voltage of the diode D2 thereby increases, and the voltage V_H increases accordingly. Then, when the output transistor temperature Ttr further decreases to satisfy the voltage V_H≥the voltage V_R, the comparator CMP2 sets the over temperature detection signal at_ot to inactive. This means that the output transistor temperature Ttr becomes equal to or lower than the second reference temperature Tref2. Note that the second reference temperature Tref2 is lower than the first reference temperature Tref1. A difference between the first reference temperature Tref1 and the second reference temperature Tref2 corresponds to the hysteresis ΔTref1.

Next, the over temperature detection operation at a relatively high ambient temperature (to be more specific, the second boundary temperature<the ambient temperature) is described hereinafter.

At the second boundary temperature<the ambient temperature, a drop voltage of the diode D1 is low, and therefore the voltage V_C decreases, and the voltage V_C<the voltage V_T is satisfied. Accordingly, the comparator CMP3 sets the over temperature detection signal TaOver to active. All of the switches SW4 to SW6 thereby turn off.

When the output transistor temperature Ttr increases by driving the load, a drop voltage of the diode D2 decreases, and the voltage V_H decreases accordingly. Then, when the output transistor temperature Ttr further increases to satisfy the voltage V_H<voltage V_R, the comparator CMP2 sets the over temperature detection signal at_ot to active. This means that the output transistor temperature Ttr becomes higher than the first reference temperature Tref1.

When the over temperature detection signal at_ot becomes active, the switch SW2 turns from on to off, and the switch SW3 turns from off to on. While the voltage V_H does not change when the switch SW3 turns on because the switch SW4 is off, the voltage V_R further increases when the switch SW2 turns off. The amount of increase in the voltage V_R corresponds to the hysteresis ΔTref2. Note that ΔTref2 (=15° C.)<ΔTref1 (=30° C.) in this example.

When the over temperature detection signal at_ot becomes active and thereby the output transistor T1 turns off, the output transistor temperature Ttr starts decreasing. A drop voltage of the diode D2 thereby increases, and the voltage V_H increases accordingly. Then, when the output transistor temperature Ttr further decreases to satisfy the voltage V_H≥the voltage V_R, the comparator CMP2 sets the over temperature detection signal at_ot to inactive. This means that the output transistor temperature Ttr becomes equal to or lower than the third reference temperature Tref3. Note that the third reference temperature Tref3 is lower than the first reference temperature Tref1. A difference between the first reference temperature Tref1 and the third reference temperature Tref3 corresponds to the hysteresis ΔTref2.

Note that, when the over temperature detection signal TaOver becomes active and thereby the switch SW6 turns from on to off, the voltage V_H further increases by the amount of voltage corresponding to the hysteresis ΔToref. In other words, when the over temperature detection signal TaOver becomes active, it becomes difficult to return to inactive by the amount of the hysteresis ΔToref.

As described above, the temperature detector TD2 controls the temperature difference detection signal dt_ot and the over temperature detection signal at_ot in the same manner as the case of the temperature detector TD1, and it sets the over temperature detection signal TaOver to inactive at the ambient temperature where the temperature difference detection operation works and at the ambient temperature where the over temperature detection operation works and which is relatively low, and sets the over temperature detection signal TaOver to active at the ambient temperature where the over temperature detection operation works and which is relatively high.

Because the temperature detector TD2 generates the hysteresis ΔTdref and ΔTref1 by using a common element (resistor element R2) in any case of the temperature difference detection operation and the over temperature detection operation, it is possible to maintain the hysteresis ΔTdref and ΔTref1 at the same value highly accurately in any case of the temperature difference detection operation and the over temperature detection operation. As a result, it is possible to prevent a sudden change in the restoration temperature of the current supply to the load even when the ambient temperature is close to the boundary temperature.

(Alternative Example of Temperature Detector TD2)

Figure 25:
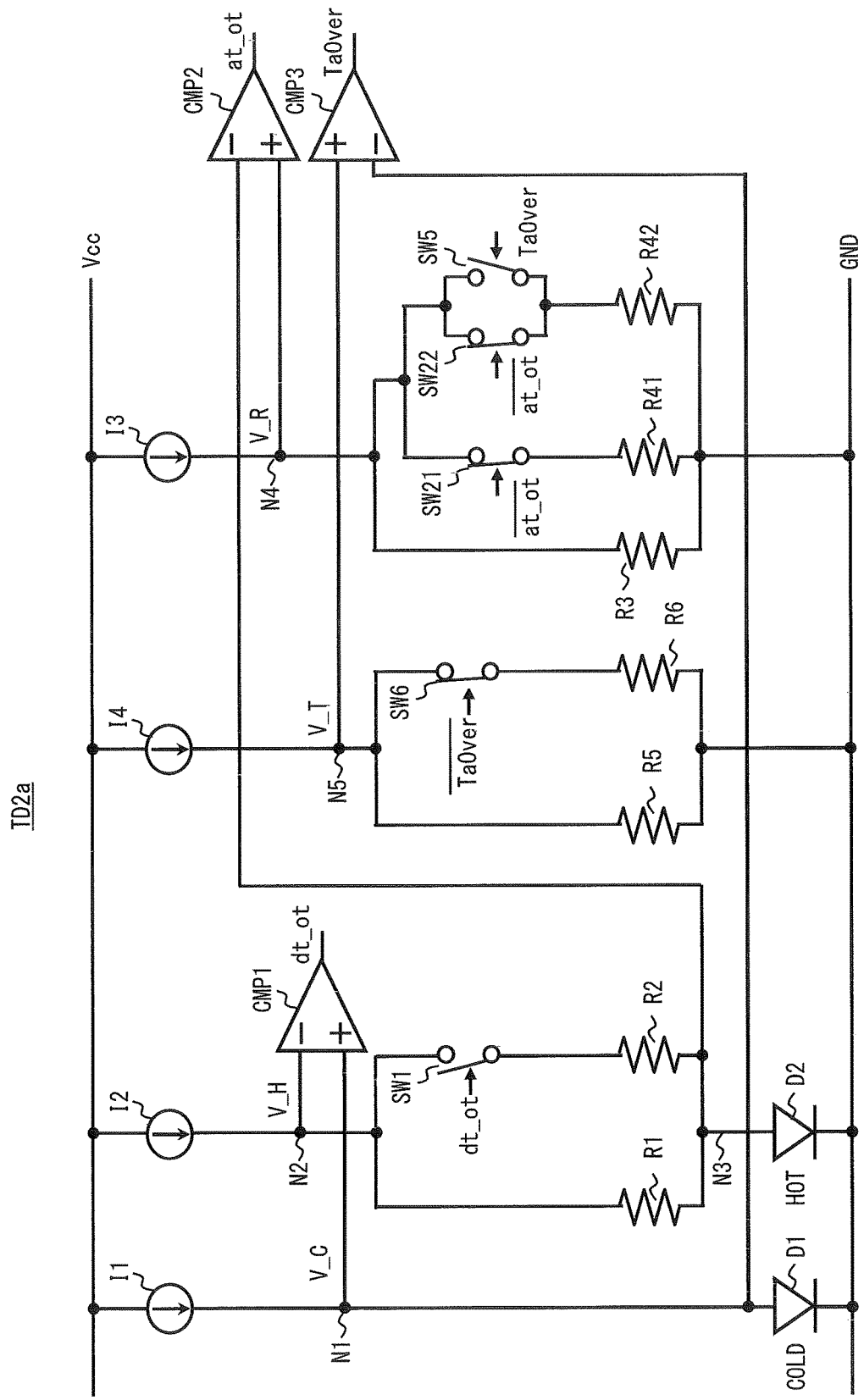
FIG. 25 is a circuit diagram showing an alternative example of the temperature detector shown in FIG. 24.

FIG. 25 is a circuit diagram showing an alternative example of the temperature detector TD2, which is a temperature detector TD2a. The temperature detector TD2a is different from the temperature detector TD2 in that it does not include the switches SW3 and SW4 but includes switches SW21 and SW22 in place of the switch SW2 and includes resistor elements R41 and R42 in place of the resistor element R4. The switches SW21 and SW22 are N-channel MOS transistors, for example.

As shown in FIG. 25, the resistor elements R41 and R42 are respectively connected in parallel to the resistor element R3. The switch SW21 is connected in series to the resistor element R41 and turns on and off based on the over temperature detection signal at_ot. For example, the switch SW21 turns on when the over temperature detection signal at_ot is inactive (L level) and turns off when the over temperature detection signal at_ot is active (H level). The switch SW22, along with the switch SW5, is connected in series to the resistor element R42 and turns on and off based on the over temperature detection signal at_ot. For example, the switch SW22 turns on when the over temperature detection signal at_ot is inactive (L level) and turns off when the over temperature detection signal at_ot is active (H level).

Further, the comparator CMP2 compares a voltage V_S of a node N3, instead of the voltage V_H of the node N2, with the voltage V_R of the node N4 and outputs the over temperature detection signal at_ot. For example, when the voltage V_S≥the voltage V_R, the comparator CMP2 sets the over temperature detection signal at_ot to inactive (L level), and when the voltage V_S<the voltage V_R, the comparator CMP2 sets the over temperature detection signal at_ot to active (H level).

The other structure of the temperature detector TD2a is the same as that of the temperature detector TD2 and thus not redundantly described.

(Specific Operation of Temperature Detector TD2a)

The specific operation of the temperature detector TD2a is described hereinafter.

Note that, in the initial state, the voltages are adjusted to satisfy the voltage V_H≥the voltage V_C, the voltage V_S≥the voltage V_R and the voltage V_C≥the voltage V_T, and therefore all of the temperature difference detection signal dt_ot and the over temperature detection signals at_ot and TaOver are inactive (L level). Accordingly, the switches SW1 and SW5 are off, and the switches SW21, SW22 and SW6 are on.

(Temperature Difference Detection Operation by Temperature Detector TD2a)

First, the temperature difference detection operation by the temperature detector TD2a is described. Note that the temperature difference detection operation works when the ambient temperature is equal to or lower than the boundary temperature.

The temperature difference detection operation by the temperature detector TD2a is the same as the temperature difference detection operation by the temperature detector TD2 and thus not redundantly described.

(Over Temperature Detection Operation by Temperature Detector TD2a)

Next, the over temperature detection operation by the temperature detector TD2a is described. Note that the over temperature detection operation works when the ambient temperature is higher than the boundary temperature.

First, the over temperature detection operation at a relatively low ambient temperature (to be more specific, the boundary temperature<the ambient temperature≤the second boundary temperature) is described hereinafter.

At the boundary temperature<the ambient temperature-≤the second boundary temperature, a drop voltage of the diode D1 is not so low, and therefore the voltage V_C does not decrease so much, and the relationship of the voltage V_C≥the voltage V_T is maintained. Accordingly, the comparator CMP3 keeps the over temperature detection signal TaOver inactive. The switch SW5 thereby turns off, and the switch SW6 turns on. As a result, the over temperature detection operation by the temperature detector TD2a at this time is substantially the same as the over temperature detection operation by the temperature detector TD1a.

To be specific, when the output transistor temperature Ttr increases by driving the load, a drop voltage of the diode D2 decreases, and the voltage V_S decreases accordingly. Then, when the output transistor temperature Ttr further increases to satisfy the voltage V_S<voltage V_R, the comparator CMP2 sets the over temperature detection signal at_ot to active. This means that the output transistor temperature Ttr becomes higher than the first reference temperature Tref1.

When the over temperature detection signal at_ot becomes active, the switches SW21 and SW22 turn from on to off. The voltage V_R thereby further increases. The amount of increase in the voltage V_R corresponds to the hysteresis ΔTref1.

When the over temperature detection signal at_ot becomes active and thereby the output transistor T1 turns off, the output transistor temperature Ttr starts decreasing. A drop voltage of the diode D2 thereby increases, and the voltage V_S increases accordingly. Then, when the output transistor temperature Ttr further decreases to satisfy the voltage V_S the voltage V_R, the comparator CMP2 sets the over temperature detection signal at_ot to inactive. This means that the output transistor temperature Ttr becomes equal to or lower than the second reference temperature Tref2. Note that the second reference temperature Tref2 is lower than the first reference temperature Tref1. A difference between the first reference temperature Tref1 and the second reference temperature Tref2 corresponds to the hysteresis ΔTref1.

Next, the over temperature detection operation at a relatively high ambient temperature (to be more specific, the second boundary temperature<the ambient temperature) is described hereinafter.

At the second boundary temperature<the ambient temperature, a drop voltage of the diode D1 is low, and therefore the voltage V_C decreases, and the voltage V_C<the voltage V_T is satisfied. Accordingly, the comparator CMP3 sets the over temperature detection signal TaOver to active. The switch SW5 thereby turns on, and the switch SW6 turns off.

When the output transistor temperature Ttr increases by driving the load, a drop voltage of the diode D2 decreases, and the voltage V_S decreases accordingly. Then, when the output transistor temperature Ttr further increases to satisfy the voltage V_S<voltage V_R, the comparator CMP2 sets the over temperature detection signal at_ot to active. This means that the output transistor temperature Ttr becomes higher than the first reference temperature Tref1.

When the over temperature detection signal at_ot becomes active, the switches SW21 and SW22 turns from on to off. While the current flows through the resistor element R42 even when the switch SW22 turns off because the switch SW5 is on, the current does not flow through the resistor element R42 when the switch SW21 turns off. The voltage V_R thereby further increases. The amount of increase in the voltage V_R corresponds to the hysteresis ΔTref2. Note that ΔTref2 (=15° C.)<ΔTref1 (=30° C.) in this example.

When the over temperature detection signal at_ot becomes active and thereby the output transistor T1 turns off, the output transistor temperature Ttr starts decreasing. A drop voltage of the diode D2 thereby increases, and the voltage V_S increases accordingly. Then, when the output transistor temperature Ttr further decreases to satisfy the voltage V_S the voltage V_R, the comparator CMP2 sets the over temperature detection signal at_ot to inactive. This means that the output transistor temperature Ttr becomes equal to or lower than the third reference temperature Tref3. Note that the third reference temperature Tref3 is lower than the first reference temperature Tref1. A difference between the first reference temperature Tref1 and the third reference temperature Tref3 corresponds to the hysteresis ΔTref2.

Note that, when the over temperature detection signal TaOver becomes active and thereby the switch SW6 turns from on to off, the voltage V_T further increases by the amount of voltage corresponding to the hysteresis ΔToref. In other words, when the over temperature detection signal TaOver becomes active, it becomes difficult to return to inactive by the amount of the hysteresis ΔToref.

As described above, the temperature detector TD2a controls the temperature difference detection signal dt_ot and the over temperature detection signal at_ot in the same manner as the case of the temperature detector TD1a, and it sets the over temperature detection signal TaOver to inactive at the ambient temperature where the temperature difference detection operation works and at the ambient temperature where the over temperature detection operation works and which is relatively low, and sets the over temperature detection signal TaOver to active at the ambient temperature where the over temperature detection operation works and which is relatively high.

In the temperature detector TD2a, by adjustment of the resistance values of the resistor elements R2, R41 and R42 and the like, the hysteresis ΔTdref and the hysteresis ΔTref1 are maintained at the same value in any case of the temperature difference detection operation and the over temperature detection operation. As a result, it is possible to prevent a sudden change in the restoration temperature of the current supply to the load even when the ambient temperature is close to the boundary temperature. Note that, however, because the temperature detector TD2 shown in FIG. 24 generates the hysteresis ΔTdref and ΔTref1 by using a common element (resistor element R2), it is possible to maintain the hysteresis ΔTdref and ΔTref1 at the same value more accurately than the temperature detector TD2a.

Note that the structure of the temperature detectors TD2 and TD2a is not limited to the above, and it may be appropriately modified to another structure having the same function.

As described above, the load driving devices 10 and 20 according to the first and second embodiments make the current flowing through the output transistor T1 after the restoration of the current supply (which is the limited current value) constant in any case of the temperature difference detection operation and the over temperature detection operation, and slowly reduces the power supplied to the load with an increase in the ambient temperature by using the characteristics that the time required for discharge of the output transistor T1 becomes longer as the ambient temperature is higher (in other words, achieves the temperature derating of power supply) in the over temperature detection operation. The load driving devices 10 and 20 can thereby prevent a sharp decrease in the capability of driving a load even when the over temperature detection operation works due to a slight change in the ambient temperature. As a result, when lighting a lamp, for example, the load driving devices 10 and 20 can light the lamp stably without a sharp decrease in the driving capability due to the effect of the current at the initial stage of driving.

Further, the load driving device 20 according to the second embodiment described above reduces the hysteresis between the shutoff temperature and the restoration temperature of the current supply and sets the limited current value to very low in the over temperature detection operation at a relatively high ambient temperature. The load driving device 20 can thereby reduce the possibility that the ambient temperature becomes higher than the restoration temperature to cause a failure in the restoration of the current supply.

Although embodiments of the present invention are described specifically in the foregoing, the present invention is not restricted to the above-described embodiments, and various changes and modifications may be made without departing from the scope of the invention.

For example, in the semiconductor device according to the above embodiment, the conductivity type (P type or N type) of a semiconductor substrate, a semiconductor layer, a diffusion layer (diffusion region) and the like may be inverted. Accordingly, when one conductivity type of N type and P type is a first conductivity type and the other conductivity type thereof is a second conductivity type, the first conductivity type may be P type and the second conductivity type may be N type, or the first conductivity type may be N type and the second conductivity type may be P type on the contrary.

The first and second embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
   an output transistor electrically connected to a power supply voltage terminal and an output terminal;
   a temperature detector that sets a first detection signal to active when a temperature difference between a temperature of the output transistor and an ambient temperature becomes more than a reference temperature difference, and sets a second detection signal to active when a temperature of the output transistor becomes higher than a first reference temperature; and
   a first current limiter that limits a current flowing between a source and a drain of the output transistor when any one of the first and second detection signals becomes active, wherein
   the output transistor turns on and off based on an external input signal when both of the first and second detection signals are inactive,
   the output transistor turns off regardless of the external input signal when any one of the first and second detection signals is active,
   when the first detection signal is set to active, the temperature detector sets the first detection signal to inactive when the temperature difference between the temperature of the output transistor and the ambient temperature decreases to be equal to or less than a value being smaller than the reference temperature difference by a specified amount, and
   when the second detection signal is set to active, the temperature detector sets the second detection signal to inactive when the temperature of the output transistor decreases to be equal to or less than a value being lower than the first reference temperature by the specified amount.

2. The semiconductor device according to claim 1, wherein the first current limiter makes a gate and a source of the output transistor conducting through a first resistor component when any one of the first and second detection signals becomes active.

3. A semiconductor device comprising:
   an output transistor electrically connected to a power supply voltage terminal and an output terminal;
   a temperature detector that sets a first detection signal to active when a temperature difference between a temperature of the output transistor and an ambient temperature becomes more than a reference temperature difference, and sets a second detection signal to active when a temperature of the output transistor becomes higher than a first reference temperature; and
   a first current limiter that limits a current flowing between a source and a drain of the output transistor when any one of the first and second detection signals becomes active, wherein the output transistor turns on and off based on an external input signal when both of the first and second detection signals are inactive,
the output transistor turns off regardless of the external input signal when any one of the first and second detection signals is active, and
the temperature detector includes
  a first constant current source,
  a first diode connected in series to the first constant current source and placed in a peripheral circuit region away from the output transistor,
  a second constant current source,
  a second diode connected in series to the second constant current source and placed in the output transistor or its proximity,
  first and second resistor elements connected in parallel between the second constant current source and the second diode,
  a first switch connected in series to the second resistor element and controlled to turn on and off based on the first detection signal,
  a second switch connected in parallel to the first switch and controlled to turn on and off based on the second detection signal,
  a first comparator that compares a potential of a node between the first constant current source and the first diode with a potential of a node between the second constant current source and the first resistor element and outputs the first detection signal,
  a third constant current source,
  a third resistor element connected in series to the third constant current source, and
  a second comparator that compares a potential of a node between the third constant current source and the third resistor element with a potential of the node between the second constant current source and the first resistor element and outputs the second detection signal.

4. The semiconductor device according to claim 1, further comprising:
  a second current limiter, wherein
  the temperature detector further sets a third detection signal to active when the ambient temperature becomes higher than a boundary temperature that is higher than a temperature being lower than the first reference temperature by the reference temperature difference and that is lower than the first reference temperature, and
  the second current limiter, together with the first current limiter, limits a current flowing between the source and the drain of the output transistor when both of the second and third detection signals become active.

5. The semiconductor device according to claim 1, wherein the temperature detector includes
  a first constant current source,
  a first diode connected in series to the first constant current source and placed in a peripheral circuit region away from the output transistor,
  a second constant current source,
  a second diode connected in series to the second constant current source and placed in the output transistor or its proximity,
  first and second resistor elements connected in parallel between the second constant current source and the second diode,
  a first switch connected in series to the second resistor element and controlled to turn on and off based on the first detection signal,
  a second switch connected in parallel to the first switch and controlled to turn on and off based on the second detection signal,
  a third switch connected in series to the second switch and controlled to turn on and off based on a third detection signal,
  a first comparator that compares a potential of a node between the first constant current source and the first diode with a potential of a node between the second constant current source and the first resistor element and outputs the first detection signal,
  a third constant current source,
  a third resistor element connected in series to the third constant current source,
  a fourth resistor element connected in parallel to the third resistor element,
  a fourth switch connected in series to the fourth resistor element and controlled to turn on and off based on the second detection signal,
  a fifth switch connected in parallel to the fourth switch and controlled to turn on and off based on the third detection signal,
  a second comparator that compares a potential of a node between the third constant current source and the third resistor element with a potential of the node between the second constant current source and the first resistor element and outputs the second detection signal,
  a fourth constant current source,
  a fifth resistor element connected in series to the fourth constant current source,
  a sixth resistor element connected in parallel to the fifth resistor element,
  a sixth switch connected in series to the sixth resistor element and controlled to turn on and off based on the third detection signal, and
  a third comparator that compares a potential of a node between the fourth constant current source and the fifth resistor element with a potential of the node between the first constant current source and the first diode and outputs the third detection signal.

6. The semiconductor device according to claim 1, wherein the first current limiter at least includes a first switch that is connected between a gate and a source of the output transistor and turns on in synchronization with a time when any one of the first and second detection signals becomes active.

7. The semiconductor device according to claim 4, wherein
  the first current limiter at least includes a first switch that is connected between a gate and a source of the output transistor and turns on in synchronization with a time when any one of the first and second detection signals becomes active, and
  the second current limiter at least includes a second switch that is connected between the gate and the source of the output transistor in parallel with the first switch and turns on in synchronization with a time when both of the second and third detection signals become active.

8. An on-vehicle electronic device comprising:
  a processing unit; and the semiconductor device according to claim 1 that is supplied with the external input signal from the processing unit and supplies a current to a load from the output terminal.

9. The on-vehicle electronic device according to claim 8, wherein the load is a lamp of a vehicle.

10. An automobile equipped with the on-vehicle electronic device according to claim 9.

* * * * *